(12) United States Patent
Lee et al.

(10) Patent No.: US 9,647,609 B2
(45) Date of Patent: May 9, 2017

(54) TRANSCEIVER USING TECHNIQUE FOR IMPROVEMENT OF PHASE NOISE AND SWITCHING OF PHASE LOCK LOOP (PLL)

(71) Applicants: Samsung Electronics Co., Ltd., Suwon-si (KR); Sungkyunkwan University Foundation for Corporate Collaboration, Suwon-si (KR)

(72) Inventors: Jaesup Lee, Yongin-si (KR); Hong Jin Kim, Suwon-si (KR); Hyung Gu Park, Suwon-si (KR); Kang Yoon Lee, Suwon-si (KR)

(73) Assignees: Samsung Electronics Co., Ltd., Suwon-si (KR); SUNGKYUNKWAN UNIVERSITY FOUNDATION FOR CORPORATE COLLABORATION, Suwon-si (KR)

( * ) Notice: Subject to any disclaimer, the term of this patent is extended or adjusted under 35 U.S.C. 154(b) by 820 days.

(21) Appl. No.: 13/891,474

(22) Filed: May 10, 2013

(65) Prior Publication Data
US 2013/0316661 A1    Nov. 28, 2013

Related U.S. Application Data

(60) Provisional application No. 61/645,131, filed on May 10, 2012.

(30) Foreign Application Priority Data

May 25, 2012  (KR) .................. 10-2012-0056102
Aug. 31, 2012  (KR) .................. 10-2012-0096189

(51) Int. Cl.
*H04B 1/06*   (2006.01)
*H04B 7/00*   (2006.01)
(Continued)

(52) U.S. Cl.
CPC ......... *H03C 3/0975* (2013.01); *H03B 5/1215* (2013.01); *H03B 5/1228* (2013.01);
(Continued)

(58) Field of Classification Search
None
See application file for complete search history.

(56) References Cited

U.S. PATENT DOCUMENTS 6,072,371 A   6/2000  Kobayashi et al.
6,281,758 B1  8/2001  Elsayed et al.
(Continued)

FOREIGN PATENT DOCUMENTS

CN   1981450 A      6/2007
JP   2012-19378 A   1/2012
(Continued)

OTHER PUBLICATIONS

International Search Report issued Aug. 12, 2013 in counterpart International Patent Application No. PCT/KR2013/004163.
(Continued)

*Primary Examiner* — Tuan A Tran
(74) *Attorney, Agent, or Firm* — NSIP Law

(57) ABSTRACT

A transceiver may include a reception (Rx) radio frequency (RF) part configured to process a received signal, a transmission (Tx) RF part configured to process a transmitted signal, and a phase lock loop (PLL) configured to provide a reception frequency to the reception RF part and provide a transmission frequency to the transmission RF part. The PLL may be controlled according to whether the reception RF part or the transmission RF part is on. In addition, a transceiver may include quenching waveform generator (QWGs) to control quenching waveforms of the RF parts corresponding to a plurality of antennas. The quenching waveforms may be generated respectively by VCOs oper-
(Continued)

ating at a same frequency. The QWGs may control the VCOs such that the quenching waveforms do not overlap.

43 Claims, 27 Drawing Sheets

(51) Int. Cl.
*H03C 3/09* (2006.01)
*H03B 5/12* (2006.01)
*H03L 7/089* (2006.01)
*H03L 7/099* (2006.01)
*H03L 7/107* (2006.01)
*H04L 27/00* (2006.01)

(52) U.S. Cl.
CPC ......... *H03C 3/0916* (2013.01); *H03C 3/0991* (2013.01); *H03L 7/0895* (2013.01); *H03L 7/0898* (2013.01); *H03L 7/099* (2013.01); *H03L 7/1072* (2013.01); *H03B 2200/0062* (2013.01); *H04L 2027/0016* (2013.01); *H04L 2027/0022* (2013.01); *H04L 2027/0055* (2013.01)

(56) References Cited

U.S. PATENT DOCUMENTS

| | | | | |
|---|---|---|---|---|
| 6,366,622 | B1* | 4/2002 | Brown | H04B 1/30 329/304 |
| 6,834,183 | B2* | 12/2004 | Black | H01Q 3/267 331/17 |
| 7,162,216 | B2* | 1/2007 | Kasahara | H03L 7/0891 455/259 |
| 7,242,255 | B1 | 7/2007 | Chen et al. | |
| 7,301,416 | B2* | 11/2007 | Yamamoto | H03J 1/005 331/14 |
| 7,683,784 | B2* | 3/2010 | Nagai | G06K 7/0008 235/380 |
| 7,944,867 | B2* | 5/2011 | Usuba | H04W 48/08 370/311 |
| 8,036,710 | B2* | 10/2011 | Walton | H04W 52/029 455/562.1 |
| 2002/0054657 | A1 | 5/2002 | Lee | |
| 2004/0017268 | A1 | 1/2004 | Rogers | |
| 2005/0250452 | A1 | 11/2005 | Walton et al. | |
| 2007/0149143 | A1* | 6/2007 | Kim | H04B 1/0071 455/76 |
| 2010/0255802 | A1 | 10/2010 | Pan et al. | |
| 2011/0195675 | A1 | 8/2011 | Nitsche | |

FOREIGN PATENT DOCUMENTS

| | | |
|---|---|---|
| KR | 10-2011-0084454 | 7/2011 |
| KR | 10-2012-0028391 | 3/2012 |
| KR | 10-2012-0061459 | 6/2012 |
| KR | 10-2012-0061472 | 6/2012 |
| WO | WO 2011/077481 A1 | 6/2011 |

OTHER PUBLICATIONS

Chinese Office Action issued on Sep. 2, 2015 in counterpart Chinese Patent Application No. 201380024582.0 (pp. 1-13 in English; pp. 14-21 in Chinese).

Partial Supplementary European Search issued on Apr. 13, 2016 in counterpart European Application No. 13787915.1. (7 pages in English).

Extended European Search Report issued on Sep. 23, 2016 in counterpart European Application No. 13787915.1. (14 pages in English).

* cited by examiner

TRANSCEIVER USING TECHNIQUE FOR IMPROVEMENT OF PHASE NOISE AND SWITCHING OF PHASE LOCK LOOP (PLL)

CROSS-REFERENCE TO RELATED APPLICATION(S)

This application claims the benefit under 35 U.S.C. §119 (e) of a U.S. Provisional Application No. 61/645,131, filed on May 10, 2012, in the U.S. Patent and Trademark Office, and the benefit under 35 U.S.C. §119(a) of a Korean Patent Applications No. 10-2012-0056102, filed on May 25, 2012 and No. 10-2012-0096189, filed on Aug. 31, 2012, in the Korean Intellectual Property Office, the entire disclosures of each of which are incorporated herein by reference.

BACKGROUND

1. Field

The following description relates to a transceiver applying switching of a phase locked loop (PLL) and a phase noise improvement technique.

2. Description of Related Art

Generally, a radio frequency (RF) transceiver consumes the most power in an ultra low power (ULP) system. In particular, RF blocks of an RF analog device consume the most power in the RF transceiver. In the ULP system, an amplifier consumes less power due to a short signal arrival distance, whereas a voltage controlled oscillator (VCO) and a PLL consume more power. Furthermore, because power is applied to the PLL and the VCO almost all the time in most RF transceivers, they consume a large amount of the power used by the overall system.

Moreover, interference may be generated through various routes when a plurality of VCOs are not sufficiently isolated from one another. When the amplitudes of the interference signals are greater than the amplitudes of the received signals, the received signals may fail to be recognized by the transceiver.

SUMMARY

In a one general aspect, a transceiver comprising: a reception (Rx) radio frequency (RF) part configured to process a received signal; a transmission (Tx) RF part configured to process a transmitted signal; and a phase lock loop (PLL) configured to provide a reception frequency to the reception RF part and provide a transmission frequency to the transmission RF part, where the PLL is controlled according to whether the reception RF part or the transmission RF part is on.

The PLL may include a reception voltage controlled oscillator (VCO Rx) configured to generate the reception frequency; and a transmission VCO (VCO Tx) configured to generate the transmission frequency. The PLL also may include a single common control circuit connected to the VCO Rx and the VCO Tx. The PLL may be configured to turn on the single common control circuit according to whether the Rx RF part or the Tx RF part is turned on. In addition, the PLL also may include switches connected to the VCO Rx and the VCO Tx, and the single common control circuit is connected to the VCO Rx and the VCO Tx through the switches which are switched according to whether the Rx RF part or the Tx RF part is turned on.

The single common control circuit may include: a main charge pump (CP) configured to pump a predetermined amount of charges corresponding to a pulse width detected by a phase frequency detector (PFD); and a loop filter (LF) configured to vary a control voltage according to the predetermined amount of charges for the VCO Rx or the VCO Tx.

The PLL also may include: a mismatch compensation device configured to independently control a magnitude of a source current applied to the main CP and a magnitude of a sink current applied to the main CP to compensate for a current mismatch generated in the main CP. The mismatch compensation device may include: a first tuning device configured to control a sink current of an auxiliary CP according to a result detected from a sensing capacitor and perform discrete tuning with respect to the current mismatch generated in the main CP by; and a second tuning device comprising a mismatch current mirror configured to compensate for the current mismatch based on a result of the discrete tuning.

The first tuning device may include: a CP controller configured to detect a voltage generated by the sensing capacitor and to control the sink current of the auxiliary CP according to the detected voltage; and a clock generator configured to provide the CP controller with an external clock supplied from outside of the PLL.

The second tuning device may include comprises: a replica CP configured to provide the result of the discrete tuning; and a comparator configured to compare voltages of opposite poles of the sensing capacitor and generate a result, where the mismatch current mirror is further configured to compensate for the current mismatch based on the result of the comparator.

The PLL may be configured to control a lock time with respect to the reception frequency or the transmission frequency by controlling a bandwidth of the main CP. The PLL also may be configured to accelerate the lock time by increasing the bandwidth of the main CP and to control phase noise caused when the PLL is turned off by reducing the bandwidth of the main CP.

The PLL may include a leakage compensation device configured to compensate for a voltage leaking from the VCO Rx or the VCO Tx when the PLL is turned off. The leakage compensation device may be configured to compensate for the leaking voltage using: a locked control voltage at the time the transmission frequency locks or the time the reception frequency lock; and a control voltage that is varied when the Rx RF part or the Tx RF part is turned off.

The leakage compensation device may include: an analog to digital converter (ADC) configured to generate a digital signal based on a difference between the locked control voltage and the varied control voltage; and a leakage current control device configured to generate a control signal, based on the digital signal, to control a leakage compensation CP configured to compensate for leaking charges. The leakage compensation device also may be configured to control a control voltage of the VCO Rx or the VCO Tx by controlling a resolution of the ADC.

The leakage compensation device may include: a comparator configured to compare a difference between the locked control voltage and the varied control voltage; and a leakage current control device configured to generate a control signal, based on a comparison result, to control a leakage compensation CP to compensate for leaking charges.

The VCO Rx or the VCO Tx may be implemented using a class-C type VCO including an inductor capacitor (LC) tank.

In another general aspect, a transceiver includes: a first radio frequency (RF) part comprising; a first voltage controlled oscillator (VCO) configured to operate a frequency and generate an output envelope; and a first quenching waveform generator (QWG) configured generate a quenching waveform to control the output envelope of the first VCO; and a second RF part comprising a second VCO configured to operated at the same frequency as the first VCO and generate an output envelope; and a second QWG configured to configured to generate a quenching waveform to control the second VCO that does that does not overlap in time with the quenching waveform generated by the first quenching waveform generator, where the output envelopes of the VCOs do not overlap and interference between VCOs is avoided.

The transceiver also may include an antenna, where the first QWG is configured to control the first VCO and generate the quenching waveform of the first RF part corresponding to the antenna, and the second QWG is configured to control the second VCO and generate the quenching waveform of the second RF part corresponding to the antenna.

The transceiver also may include a first antenna and a second antenna, where the first QWG is configured to control the quenching waveform of the first RF part corresponding to the first antenna, and the second QWG is configured to control the quenching waveform of the second RF part corresponding to the second antenna.

The first QWG and the second QWG may be configured to control the point in time of oscillation of their corresponding VCOs by controlling a current input to their corresponding VCOs. The e first QWG and the second QWG also may be configured to control the point in time of oscillation of their corresponding VCOs to correspond to when a bias current of the corresponding VCOs is greater than a predetermined critical current.

The first QWG and the second QWG also may be configured to implement a guard time assigned between the quenching waveform of the first RF part and the quenching waveform of the second RF part to prevent an output envelope of the first VCO from interfering with an output envelope of the second VCO. The guard time may have a time value greater than a quenching delay caused by discharge of the first VCO or second VCO.

In another general aspect, a transceiver includes: a plurality of antennas including a first antenna and a second antenna; a plurality of first quenching waveform generators (QWGs) configured to generate a quenching waveform of a first transmission radio frequency (Tx RF) part and a quenching waveform of a first reception RF (Rx RF) part corresponding to the first antenna; and a plurality of second QWGs configured to generate a quenching waveform of a second Tx RF part and a quenching waveform of a second Rx RF part corresponding to the second antenna, where the quenching waveforms control a plurality of voltage controlled oscillators (VCOs) operating at the same frequency, and the first QWGs and the second QWGs are configured to control the plurality of VCOs by generating quenching waveforms that do not overlap with each other.

The first QWGs and the second QWGs may be configured to control a point of time of oscillation of corresponding VCOs by controlling a current input to the corresponding VCOs.

The first QWGs and the second QWGs may be configured to implement a guard time assigned between the quenching waveforms to prevent an output of any one VCO among the plurality of VCOs from interfering with an output of any other of the plurality of VCOs. The guard time may have a time value greater than a quenching delay caused by discharge of the any one of the plurality of VCOs.

In yet another general aspect, a transceiver includes: a plurality of antennas including a first antenna and a second antenna; a first radio frequency (RF) part including a first transmission RF part and a first reception RF part corresponding to the first antenna; and a second RF part including a second transmission RF part and a second reception RF part corresponding to the second antenna, where each of the first RF part and the second RF part comprises: a phase lock loop (PLL) configured to provide a reception frequency to a corresponding reception part and provide a transmission frequency to a corresponding transmission part, and to be controlled according to whether the corresponding reception part or the corresponding transmission part is turned on; a plurality of voltage controlled oscillators (VCOs) configured to operate at a same frequency; and a plurality of quenching waveform generators (QWGs) configured to generate a quenching waveform for a corresponding transmission part and a quenching waveform for a corresponding reception part to control operation of the VCOs such that the quenching waveforms do not overlap in time.

The QWGs may be configured to control corresponding VCOs such that quenching waveforms for the corresponding transmission part and quenching waveforms for the corresponding reception part do not overlap in time.

In another general aspect, a transceiver configured to operate in a transmission (Tx) mode or a reception (Rx) mode comprises: a Rx radio frequency (RF) part configured to process a received signal; a Tx RF part configured to process a transmitted signal; and a phase lock loop (PLL) comprising a Rx voltage controlled oscillator (VCO) configured to provide a reception frequency to the reception RF part and a Tx voltage controlled oscillator (VCO) configured to provide a transmission frequency to the transmission RF part, wherein the 'Rx mode' refers to a mode in which the received signal is processed by the Rx RF part, and the 'Tx mode' refers to a mode in which the transmitted signal is processed by the Tx RF.

The transceiver also may include a common control circuit configured to be connected to the Rx VCO X when the Rx RF part is turned on in the Rx mode to generate the reception frequency and to be connected to the Tx VCO when Tx RF part is turned on in the Tx mode to generate the transmission frequency, wherein the transceiver performs transmission and reception using only the one PLL according to the on and off states of the Rx RF part and the Tx RF part.

When power is first applied to the transceiver, the PLL of the transceiver may be configured to perform initial calibration to compensate for a difference between up and down source currents of a CP of the PLL, the initial calibration not being performed in the transmission mode or the reception mode.

During the initial calibration, a control voltage of either VCO may be locked through coarse tuning and then fine tuning of the PLL.

Wherein when the transceiver operates in the Tx mode, the PLL connected to the Tx RF part may be turned on to lock to a transmission frequency for the Tx RF part, and after the Tx RF part is locked, the PLL connected to the Tx RF part may be turned off.

The transceiver also may include a leakage compensation device, wherein when the PLL connected to the transmission RF part is turned on, operation of the leakage compensation device is turned on to compensate for a voltage leaked during an off period of the PLL.

When the PLL is powered off, the voltage for only the VCO and the compensation circuit may be applied to overcome any frequency drift and phase noise deterioration that occurs when the PLL is turned off.

When the transceiver operates in the Rx mode, the PLL connected to the Rx RF part may be turned on to lock to the reception frequency for the Rx RF part, and after the Rx FR part is locked, the PLL connect to the Rx RF part may be turned off.

The transceiver also may include a leakage compensation device wherein when the PLL connected to the transmission RF part is turned on, operation of the leakage compensation device is turned on to compensate for a voltage leaked during an off period of the PLL.

When the PLL is powered off, the voltage for only the VCO and the compensation circuit may be applied overcoming any frequency drift and phase noise deterioration that occurs when the PLL is off.

The average power consumption of the PLL may be reduced by reducing the on time of the PLL and the power consumed during the off time of the PLL.

Other features and aspects will be apparent from the following detailed description, the drawings, and the claims.

BRIEF DESCRIPTION OF THE DRAWINGS

Throughout the drawings and the detailed description, unless otherwise described, the same drawing reference numerals refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses, and/or methods described herein are suggested to those of ordinary skill in the art. The progression of processing steps and/or operations described is provided as an example unless otherwise stated, and the sequence of processing steps and/or operations is not limited to that set forth herein and may be changed as is known in the art, unless otherwise stated. Also, description of well-known functions and constructions may be omitted for increased clarity and conciseness.

Figure 1:
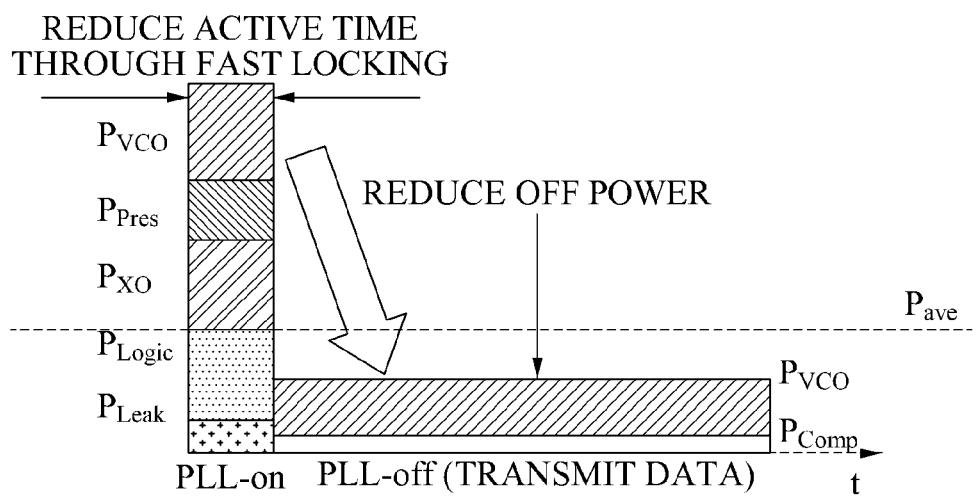
FIG. 1 is a diagram illustrating an example of a method of reducing power consumption in a phase lock loop (PLL) included in a transceiver.

FIG. 1 illustrates an example of reducing power consumption in a PLL included in a transceiver.

Power consumption of a PLL and a VCO is significant in an ULP system. Therefore, according to one example, a desired transmission frequency is quickly locked using a fast lock technique before data transmission as shown in FIG. 1, thereby reducing the time of peak power consumption when the PLL is on (PLL-on) and accordingly reducing overall power consumption.

According to this example, when the PLL is powered off (e.g., during data transmission), the voltage $P_{VCO}+P_{Comp}$ for only a VCO and a compensation circuit (COMP) is applied. As a result, frequency drift and phase noise deterioration occurring when the PLL is off (PLL-off) can be overcome. Furthermore, according to this example, average power consumption $P_{ave}$ of P of the PLL is reduced by reducing the on time of the PLL and the power consumed during the off time of the PLL.

Figure 2:
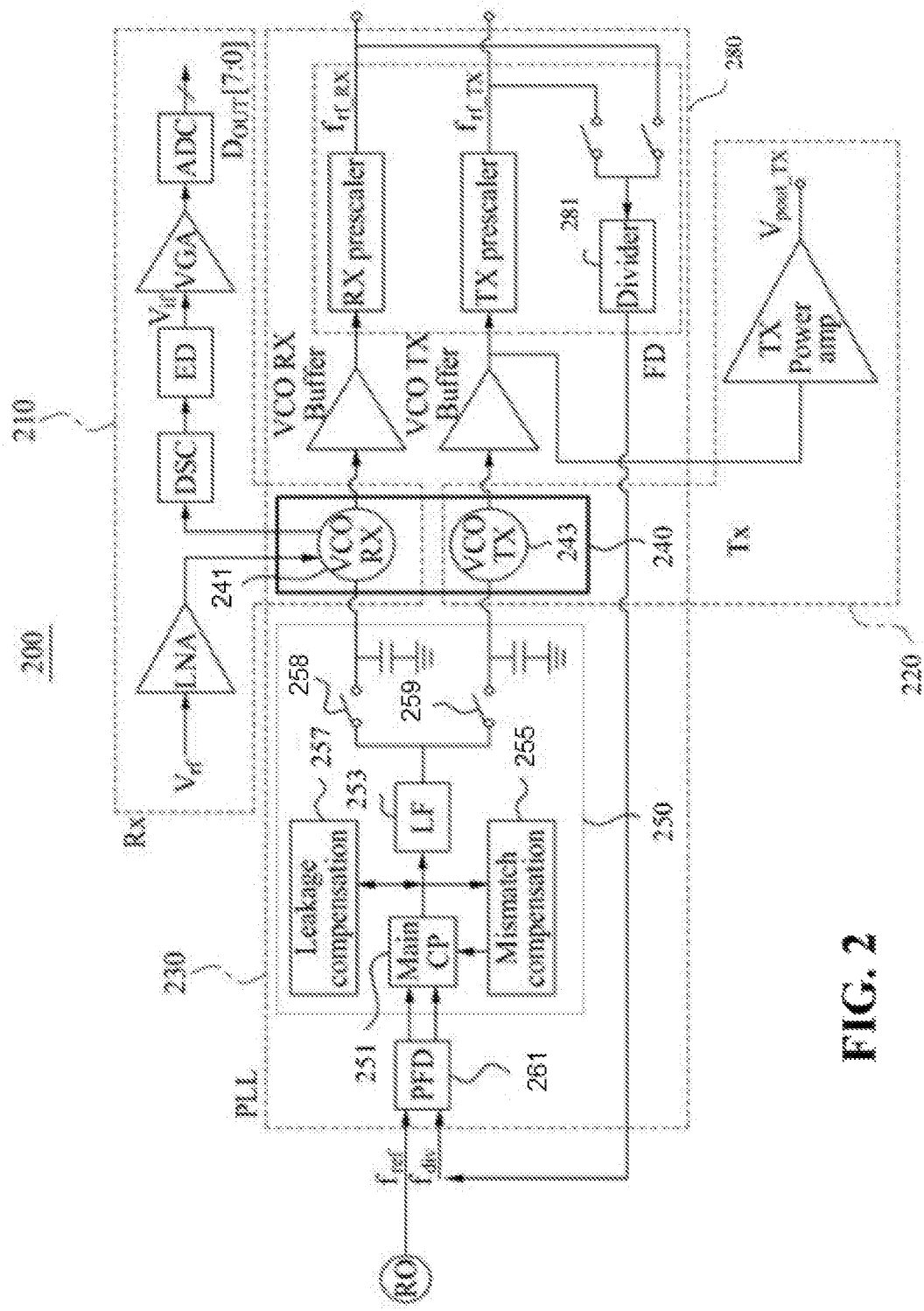
FIG. 2 is a block diagram illustrating an example of a transceiver.

FIG. 2 is a circuit diagram illustrating an example of a transceiver 200. The example provided for the transceiver 200 may be applied to any of a time division duplex (TDD) system and a frequency division duplex (FDD) system according to the description herein, and is provided as an illustrating example.

Referring to FIG. 2, the transceiver 200 includes a reception (Rx) RF part 210, a transmission (Tx) RF part 220, and a PLL 230.

The Rx RF part 210 processes a received signal. Since the Rx RF part 210 is configured in a manner that is generally known for a receiver, a detailed description of its configuration is omitted. The Tx FR part includes a transmission power amplifier.

The Tx RF part 220 processes a transmitted signal. Since the Tx RF part 220 is configured in a manner that is generally known for a transmitter, a detailed description its configuration is omitted.

The PLL 230 provides the Rx RF part 210 with a reception frequency and provides the Tx RF part 220 with a transmission frequency. The PLL 230 can be controlled according to whether the Rx RF part 210 or the Tx RF part 220 is turned on. The Rx RF part 210 can be turned on in a reception mode and the Tx RF part 220 can be turned on in a transmission mode.

The PLL 230 includes a plurality of VCOs 240. In further detail, the PLL 230 may include a reception VCO (VCO Rx) 241 to generate the reception frequency, and a transmission VCO (VCO Tx) 243 to generate the transmission frequency.

In addition, the PLL 230 also includes a single common control circuit 250 connected to the VCO Rx 241 and the VCO Tx 243. The PLL 230 turns on the single common control circuit 250 according to whether the Rx RF part 210 or the Tx RF part 220 is on. The single common control circuit 240 also includes a main charge pump (CP) 251 and a loop filter (LF) 253. In addition, the PLL 230 also includes a mismatch compensation device 255 and a leakage compensation device 257. The single common control circuit 250 can be connected to the VCO Rx 241 and the VCO Tx 243 through switches 248 and 249, respectively. The switches 248 and 249 are switched according to whether the Rx RF part 210 or the Tx RF part 220 is on.

The main CP 251 pumps a predetermined amount of charges corresponding to a pulse width detected by a phase frequency detector (PFD) 261. The main CP 251 may push or pull a predetermined amount of charges (i.e., a current proportional to the pulse width output from the PFD 231) according to a pulse sign. In this example, a current gain Icp may be generated during conversion from the pulse to the current. The current gain Icp can seriously affect performance of the PLL 230 including the lock time of the PLL 230. The LF 253 varies a control voltage for the VCO Rx 241 or the VCO Tx 243 according to the predetermined amount of charges pumped by the main CP 251.

The PLL 230 also includes a Frequency Divider (FD) portion 280. The FD portion 280 includes a divider 281 receiving input from the transmission frequency $f_{rf\_TX}$ or reception frequency $f_{rf\_RX}$ and outputs an output frequency $f_{div}$.

In this example, the PFD 261 compares a reference frequency $f_{ref}$ from a reference oscillator (RO) with the output frequency $f_{div}$ from the divider 280, and outputs a pulse width or pulse train corresponding to the difference between the reference frequency $f_{ref}$ and the output frequency $f_{div}$.

The mismatch compensation device 255 controls the magnitude of a source current and the magnitude of a sink current applied to the main CP 251, independently, to compensate for a current mismatch occurring in the main CP 251. The operation of the mismatch compensation device 255 is described in greater detail below with reference to FIGS. 7 and 8.

The leakage compensation device 257 compensates for a voltage leaking from the VCO Rx 241 or the VCO Tx 243 when the PLL 230 is turned off. The PLL 230 can be turned off when the Rx RF part 210 or the Tx RF part 220 is turned off. The operation of the leakage compensation device 257 is described in greater detail below with reference to FIG. 9.

Figure 3:
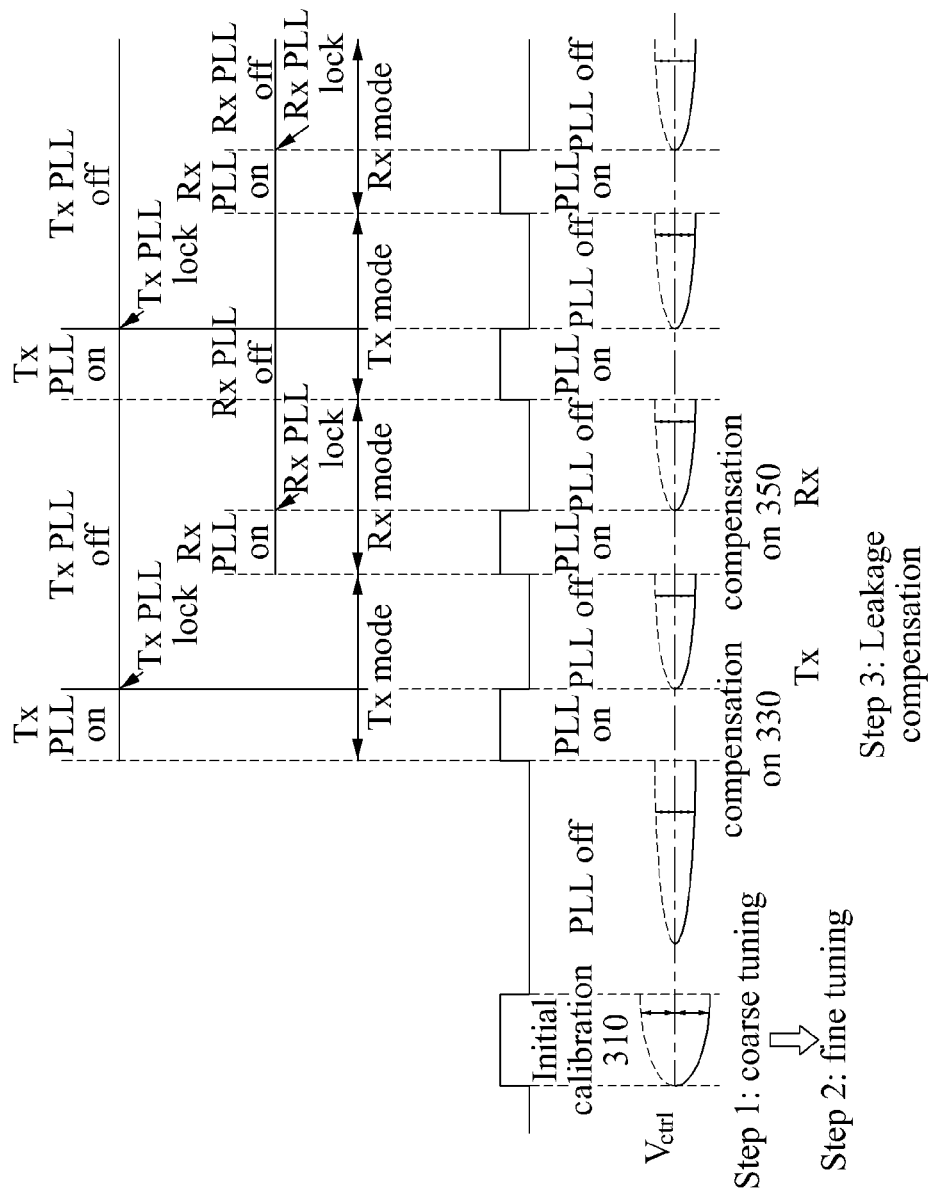
FIG. 3 is a timing diagram according to an example of transmission and reception modes of a transceiver.

FIG. 3 illustrates an example of the transmission and reception modes of a transceiver. Referring to FIG. 3, the transceiver 200 according to one example, may switch on or off the Rx RF part 210 and the Tx RF part 220 of FIG. 2 according to the transmission and reception modes. In addition, the transceiver 200 may compensate for a control voltage $V_{CTRL}$ of a VCO (e.g., VCOs 241 or 243) and a current of the CP 251 when the PLL 230 is turned on according to the on and off states of the respective parts.

The transceiver 200 is converted to a transmission (Tx) mode or a reception (Rx) mode by a control signal received from a modem or a media access control (MAC) layer. The 'Rx mode' refers to a mode in which a received signal is processed by the Rx RF part 210, and the 'Tx mode' refers to a mode in which a transmitted signal is processed by the Tx RF part 220. When the Rx RF part 210 is turned on in the Rx mode, the single common control circuit 250 is connected to the VCO Rx 241 to generate a reception frequency by switching of the switch 248. When the Tx RF part 220 is turned on in the Tx mode, the single common control circuit 250 is connected to the VCO Tx 243 to generate a transmission frequency by switching of the switch 249. Thus, according to this example, transmission and reception may be performed using the single common control circuit 250 (i.e., with only one PLL 230) according to the on and off states of the Rx RF part 210 and the Tx RF part 220.

The operation of the transceiver according to the transmission mode and the reception mode is now described with reference to FIG. 3.

When power is first applied to the transceiver, a PLL of the transceiver may perform initial calibration 310 to compensate for a difference between up and down source currents of a CP. The initial calibration 310 is not performed in the transmission mode or the reception mode. During the initial calibration 310, a control voltage $V_{CTRL}$ for a VCO may be locked through coarse tuning and fine tuning. The coarse tuning and the fine tuning are described in further detail below with reference to FIGS. 7 and 8.

The transceiver operates in the Tx mode according to the control signal received from the modem or the MAC layer. When operating in the Tx mode, a PLL connected to a Tx RF part is turned on. When the PLL connected to the Tx RF part is turned on, a transmission frequency for the Tx RF part may be locked. After the Tx RF part is locked, the PLL connected to the Tx RF part may be turned off.

When the PLL connected to the transmission RF part is turned on (PLL On), operation of a leakage compensation device included in the PLL also may be turned on, thereby compensating for a voltage leaked during an off period of the PLL (Compensation On 330).

According to compensation of the voltage by leakage compensation device, a control voltage for a VCO (e.g., the VCO Tx 243) returns to the control voltage VCTRL initially compensated.

After the PLL connected to the Tx RF part is turned off, the transceiver may operate in the Rx mode according to the control signal received from the modem or the MAC layer. According to the operation of the transceiver in the Rx mode, a PLL connected to the Rx RF part is turned on. When the PLL connected to the Rx RF part is turned on (PLL On), the reception frequency for the Rx RF part may be locked. Accordingly, the PLL may be turned off for the Rx RF part.

When the PLL connected to the transmission RF part is turned on (PLL On), operation of a leakage compensation device included in the PLL also may be turned on, thereby compensating for a voltage leaked during an off period of the PLL (Compensation On 350).

According to compensation of the voltage by leakage compensation device, a control voltage for a VCO (e.g., the VCO Rx 241) returns to the control voltage $V_{CTRL}$ initially compensated.

Figure 4:
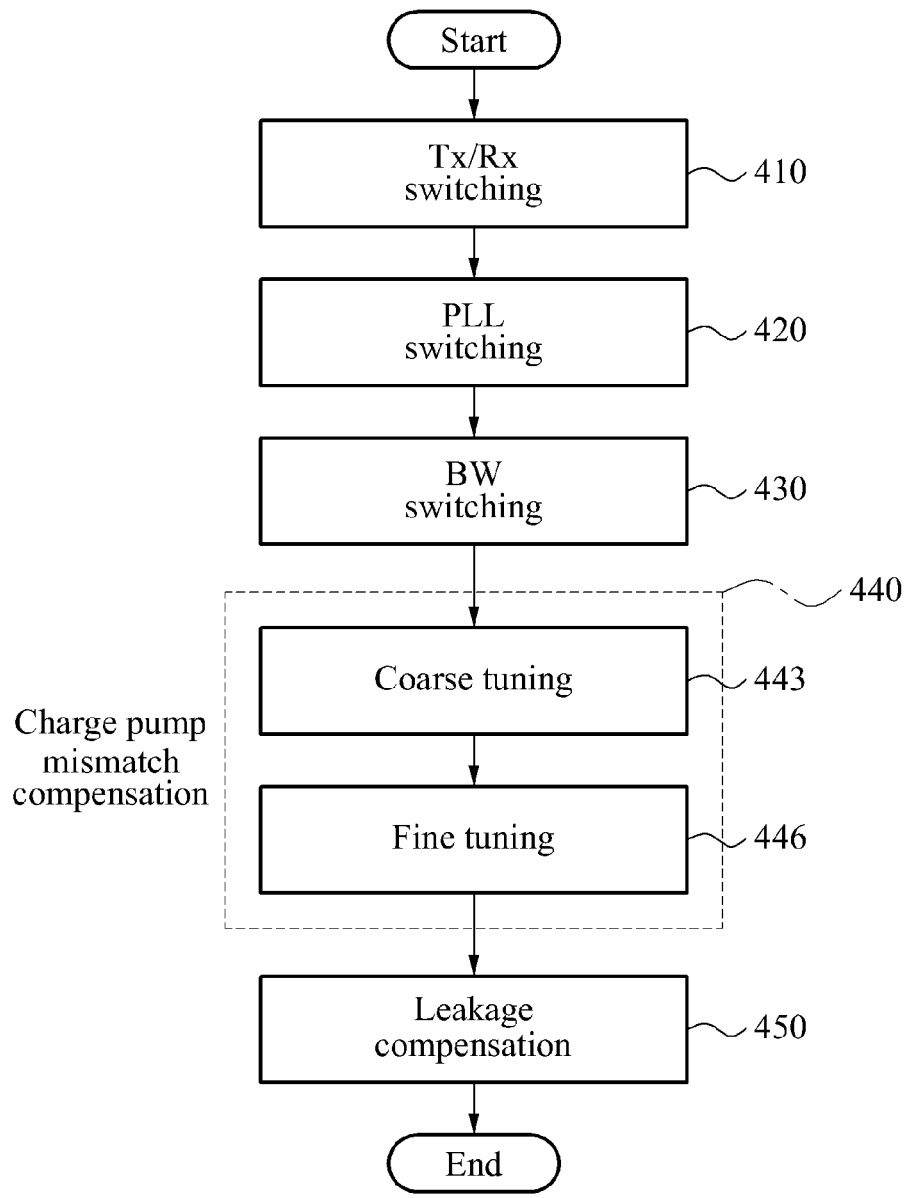
FIG. 4 is a flowchart illustrating an example of an operation method of a transceiver.

FIG. 4 illustrates an example of a method of operation of a transceiver. Referring to FIG. 4, a transceiver performs switching to a Tx mode or an Rx mode by receiving a control signal from a modem or a MAC layer in operation 410.

The PLL included in the transceiver is switched to the Tx RF part or the Rx RF according to which mode is switched to (i.e., the Tx mode or the Rx mode) in operation 420.

The transceiver may perform fast locking (e.g., bandwidth (BW) switching) for fast frequency stabilization in operation 430. For fast locking, the PLL included in the transceiver may control a lock time with respect to the reception frequency or the transmission frequency by controlling a bandwidth of a main CP. An example of a method of BW switching is described in greater detail below with reference to FIG. 6.

The transceiver may compensate for a current mismatch occurring in the CP (e.g., the main CP 251) in operation 440. When the PLL is first turned on, the transceiver may compensate for the current mismatch between current sources of the CP, for example, a source current ISOURCE and a sink current ISINK. In this example, the time when the PLL is first turned on refers to a time when power is first applied to the PLL.

In general, current mismatch characteristics of the CP vary according to processes, voltage supply, temperature changes, and the like, and may deteriorate noise characteristics of the PLL. Therefore, according to this exemplary process 440, the current mismatch is efficiently compensated through processes including coarse tuning 443 and fine tuning 446. In other words, the current mismatch may be compensated by performing the coarse tuning 443 first and the fine tuning 446 next rather than simultaneously. As are result, compensation may be relatively efficient with regard to tuning time and accuracy. The processes of coarse tuning 443 and fine tuning 446 are described in greater detail below with reference to FIGS. 7 and 8.

Next, the transceiver may perform leakage compensation to compensate for a voltage leaking from a VCO as the PLL is turned off, in operation 450. An example of a method of performing leakage compensation is described in greater detail below with reference to FIG. 9.

Figure 5:
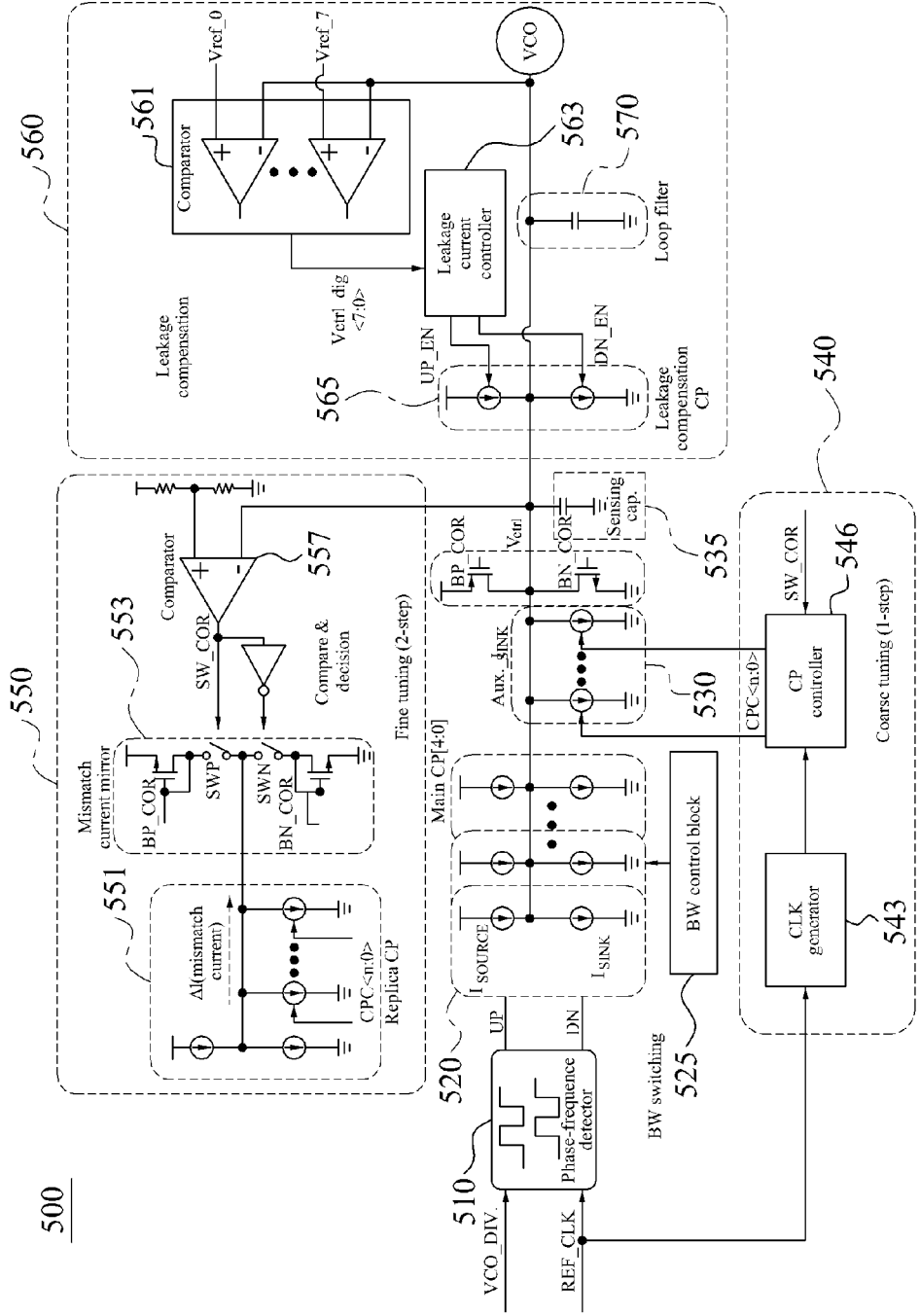
FIG. 5 is a diagram illustrating configuration of an example of a charge pump and a leakage compensation device of a PLL of a transceiver.

FIG. 5 illustrates configuration of an example of a charge pump and a leakage compensation device of a PLL 500 of a transceiver.

Referring to FIG. 5, the PLL 500 includes a phase frequency detector (PFD) 510, main CPs 520, a BW control block 525, an auxiliary CP 530, a sensing capacitor 535, a first tuning device 540, a second tuning device 550, a leakage compensation device 560, and a loop filter 570. In one example, the mismatch compensation device 255 described above may comprise the first tuning device 540 and the second tuning device 550.

The PFD 510 compares a reference frequency $f_{ref}$ with an output frequency $f_{div}$ and outputs a pulse width or pulse train corresponding to the difference between the reference frequency $f_{ref}$ and the output frequency $f_{div}$. The main CPs 520 can pump a predetermined amount of charges corresponding to the pulse width detected by the PFD 510. That is, the main CPs 520 may push or pull (according to a pulse sign), a predetermined amount of charge (i.e., a current) proportional to the pulse width output from the PFD 510.

The BW control block 525 controls a bandwidth of the PLL.

The mismatch compensation device 560 including the first tuning device 540 and the second tuning device 550 compensates for a current mismatch occurring in the main CPs 520 by controlling the magnitude of a source current $I_{source}$ and the magnitude of a sink current $I_{sink}$ applied to the main CPs 520, independently.

The first tuning device 540 performs discrete tuning with respect to the current mismatch generated in the main CPs 520 by controlling a sink current for the auxiliary CP 530 according to a detection result of the sensing capacitor 535. The first tuning device 540 may include a clock (CLK) generator 543 and a CP controller 546. The CLK generator 543 provides the CP controller 546 with an external CLK. The CP controller 546 may detect a voltage generated by the sensing capacitor 535 and control the sink current for the auxiliary CP 530 according to the detected result.

The first tuning device 540 may be referred to as a coarse tuning device that performs coarse current compensation by discrete digital tuning. Operation of the first tuning device 540 is further described below with reference to FIG. 7.

The second tuning device 550 may compensate for the current mismatch using a current mirror technique based on the result of the discrete digital tuning performed by the first tuning device 540. The second tuning device 550 includes a replica CP 551, a mismatch current mirror 553, and a comparator 557. The replica CP 551 provides the second tuning device 550 with the result of the discrete digital tuning performed by the first tuning device 540. The mismatch current mirror 553 compensates for the current mismatch by performing the current mirror technique based on the result obtained from the comparator 557 comparing the voltages of opposite poles of the sensing capacitor 535.

The second tuning device 550 may be referred to as a fine tuning device that performs fine tuning by compensating for the current mismatch of the main CP using an analog voltage. Operation of the second tuning device 550 is further described below with reference to FIG. 8.

The leakage compensation device 560 may compensate for a voltage leak using a locked control voltage at the lock time of the transmission frequency (or the lock time of the reception frequency) and a control voltage that is varies when the Rx RF part or the Tx RF part is turned off. The leakage compensation device 560 may include a comparator 561, a leakage current controller 563, and a leakage compensation CP 565. The comparator 561 compares the locked control voltage with the varied control voltage. The leakage compensation device 560 generates a control signal for the leakage compensation CP 565 based on the result output from the comparator 561 to compensate for leaking charges.

The leakage compensation device 560 may compensate for the current leak through the leakage compensation CP 565.

The loop filter 570 varies a control voltage $V_{CTRL}$ for a VCO according to the predetermined amount of charges pumped by the main CPs 520.

Figure 6:
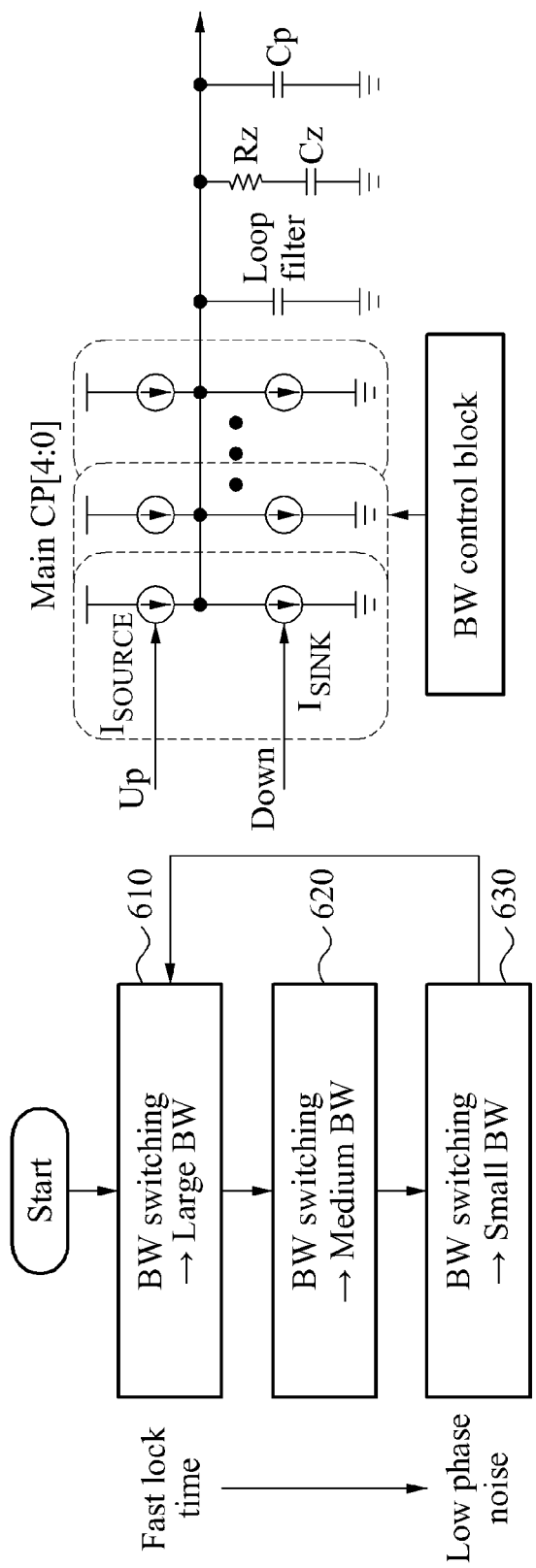
FIG. 6 is a diagram illustrating an example of a bandwidth switching method performed in a main charge pump (CP) included in a PLL of a transceiver.

FIG. 6 illustrates an example of a BW switching method performed in a main CP included in a PLL of a transceiver. Referring to FIG. 6, the PLL of the transceiver can control a lock time with respect to a reception frequency or a transmission frequency by controlling a bandwidth of the main CP. Generally, because the lock time of the PLL is inversely proportional to the bandwidth of the PLL, the lock time can be accelerated by increasing the bandwidth.

In this example, the bandwidth $\omega_c$ of the PLL may be calculated by Equation 1 below.

$$\omega_c = \frac{I_{CP} \cdot K_{VCO} \cdot R_z}{2\pi N} \cdot \frac{C_z}{C_z + C_p} \quad \text{[Equation 1]}$$

Here, $I_{CP}$ denotes a current gain of the main CP, and $K_{VCO}$ denotes a gain of the VCO, (i.e., a degree of frequency change according to a change in voltage of the VCO).

In addition, $R_z$ denotes a resistance of the loop filter. $C_z$ and $C_p$ denote capacitors of the loop filter. N denotes a division ratio of the PLL.

In this example, a BW control block can accelerate an initial lock time of the PLL by adjusting the current $I_{CP}$ of the CP and the resistance $R_z$ of the loop filter. However, when the bandwidth is increased, deterioration resulting from phase noise also may be increased. Taking this into account, the BW control block can increase the bandwidth of the main CP to a large BW in operation 610, thereby accelerating the initial lock time. Next, the BW control block can decrease the initial lock time gradually to a medium BW in operation 620 and to a small BW in operation 630. Consequently, the phase noise characteristics according to the off state of the PLL are maintained.

Figure 7:
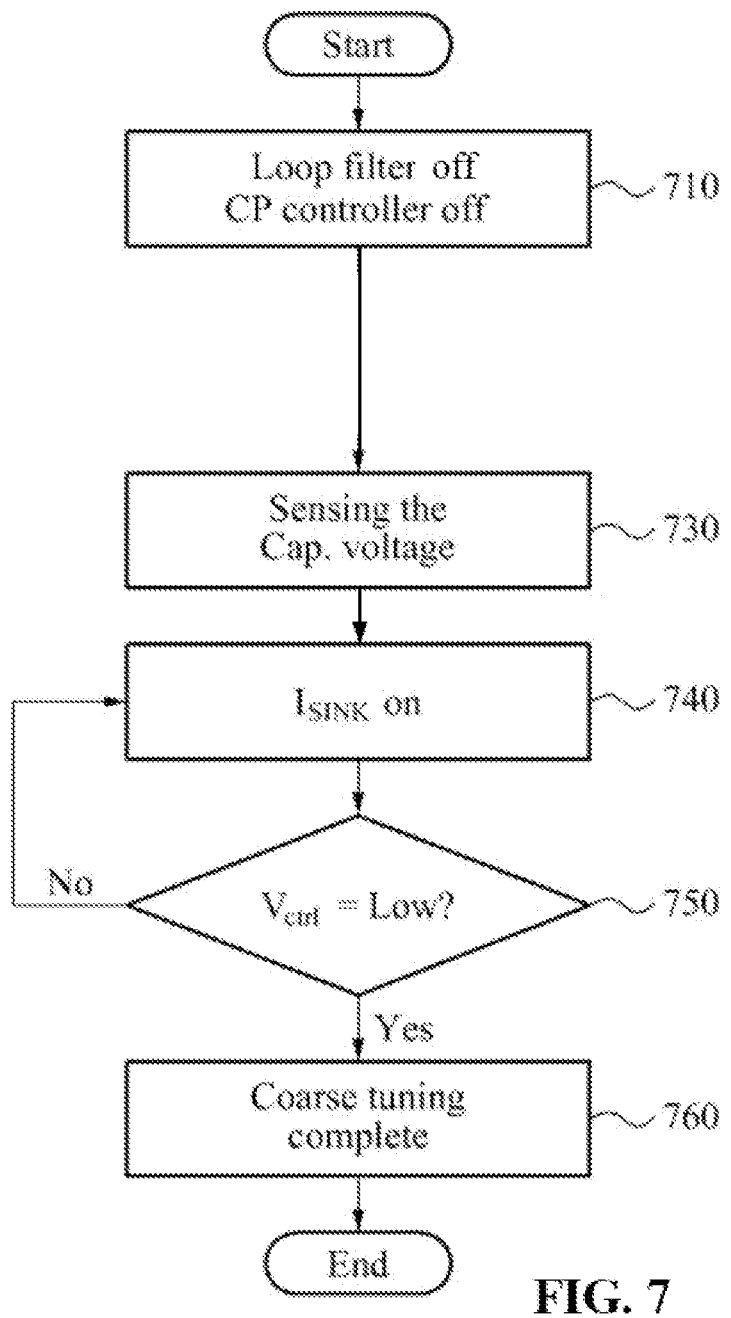
FIG. 7 is a flowchart illustrating an example of a control method for performing coarse tuning in a transceiver.

FIG. 7 illustrates an example of a control method for performing coarse tuning in a transceiver. A mismatch compensation device according to the examples described herein compensates for a current mismatch using two processes, for example, coarse tuning and fine tuning. First, the coarse tuning may be performed by a following control process.

Referring to FIG. 7, in operation 710, the mismatch compensation device interrupts connection of a loop filter so that the loop filter turns to an off state while performing the coarse tuning. Such interruption prevents the capacitance and the resistance of the loop filter from being affected by the coarse tuning.

Next, coarse tuning is starts with the mismatch compensation device detecting a voltage of a sensing capacitor in operation 730. Because the transceiver in this example is configured to initially have a source current $I_{SOURCE}$ higher than a sink current $I_{SINK}$, a high voltage at the sensing capacitor is detected. Therefore, the mismatch compensation device turns on a sink current Aux._$I_{SINK}$ (through a CP control signal received from CP controller 546 (i.e., CPC<n:0> signal a control signal with respect to n+1 CP) in operation 740.

The mismatch compensation device determines the state of a control voltage in operation 750. When the control voltage is determined to be in the low state in operation 750, the mismatch compensation device may finish the coarse tuning in operation 760. That is, when the voltage reaches a low state as the sink current Aux._$I_{SINK}$ is turned on in operation 740, the mismatch compensation device finishes the coarse tuning at that time. However, when the voltage remains in a high state, the mismatch single common control circuit continues to maintain the sink current Aux._$I_{SINK}$ on through use of the CPC<n:0> signal (operation 730).

Figure 8:
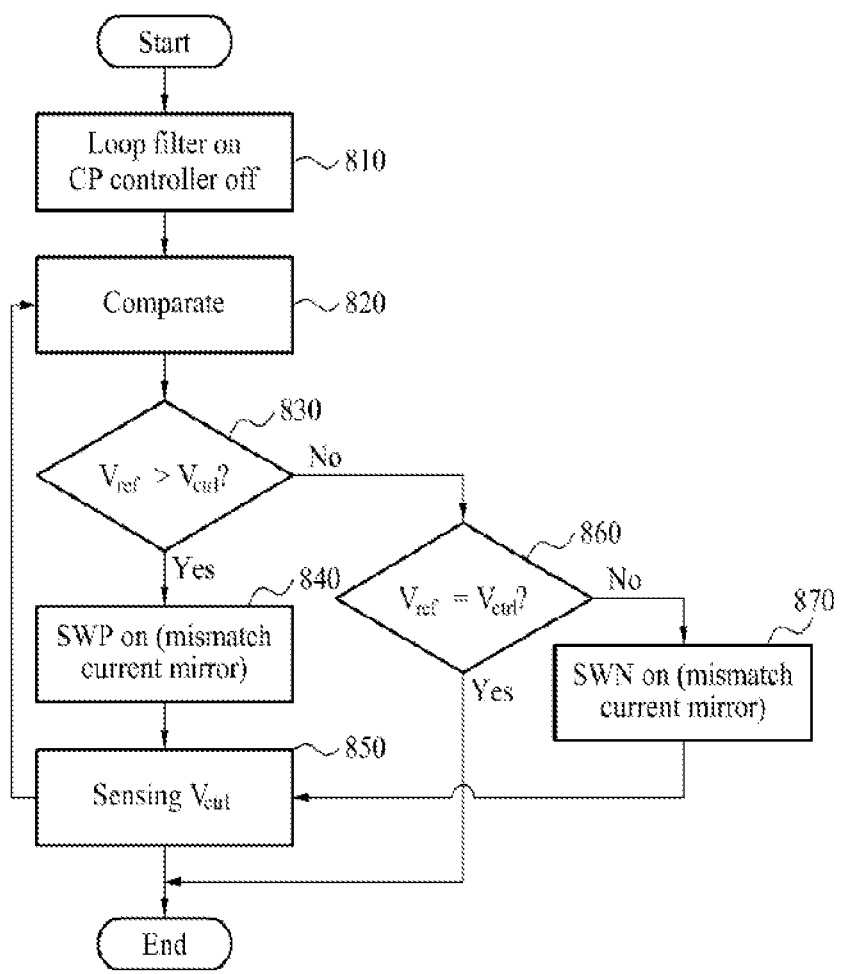
FIG. 8 is a flowchart illustrating an example of a control method for performing fine tuning in a transceiver.

FIG. 8 illustrates an example of a control method for performing fine tuning in a transceiver. A mismatch compensation device according to the examples described herein performs fine tuning after completion of the coarse tuning using the following control process.

In operation 810, when fine tuning begins, the mismatch compensation device turns off the CP controller 546 used for the coarse tuning and turns on the loop filter by reconnecting the loop filter that was disconnected during the coarse tuning.

In operation 820, the mismatch compensation device may compare a reference voltage $V_{ref}$ applied to a positive side of the comparator 557 with a control voltage $V_{ctrl}$ detected by a sensing capacitor.

In operation 830, the mismatch compensation device uses the result of the comparison of operation 820 to determine whether the reference voltage $V_{ref}$ is higher than the control voltage $V_{ctrl}$. When the reference voltage $V_{ref}$ is higher than the control voltage $V_{ctrl}$, the mismatch compensation device turns on a switch P (SWP) in the mismatch current mirror 553 to generate a fine source current, thereby increasing the control voltage $V_{ctrl}$, in operation 840. When the reference voltage $V_{ref}$ is not higher than the control voltage $V_{ctrl}$, in operation 860, it is determined whether the reference voltage $V_{ref}$ equals the control voltage $V_{ctrl}$. When the voltages are not equal, that is, the reference voltage $V_{ref}$ is lower than the control voltage $V_{ctrl}$, the mismatch compensation device turns on a switch N (SWN) in the mismatch current mirror 553 to generate a fine source current, thereby decreasing the control voltage $V_{ctrl}$, in operation 870.

After operations 840 or 879, the mismatch compensation device may sense the control voltage $V_{ctrl}$ again in operation 850 and perform comparison of operation 820. When the reference voltage $V_{ref}$ equals the control voltage $V_{ctrl}$, the process ends.

Figure 9:
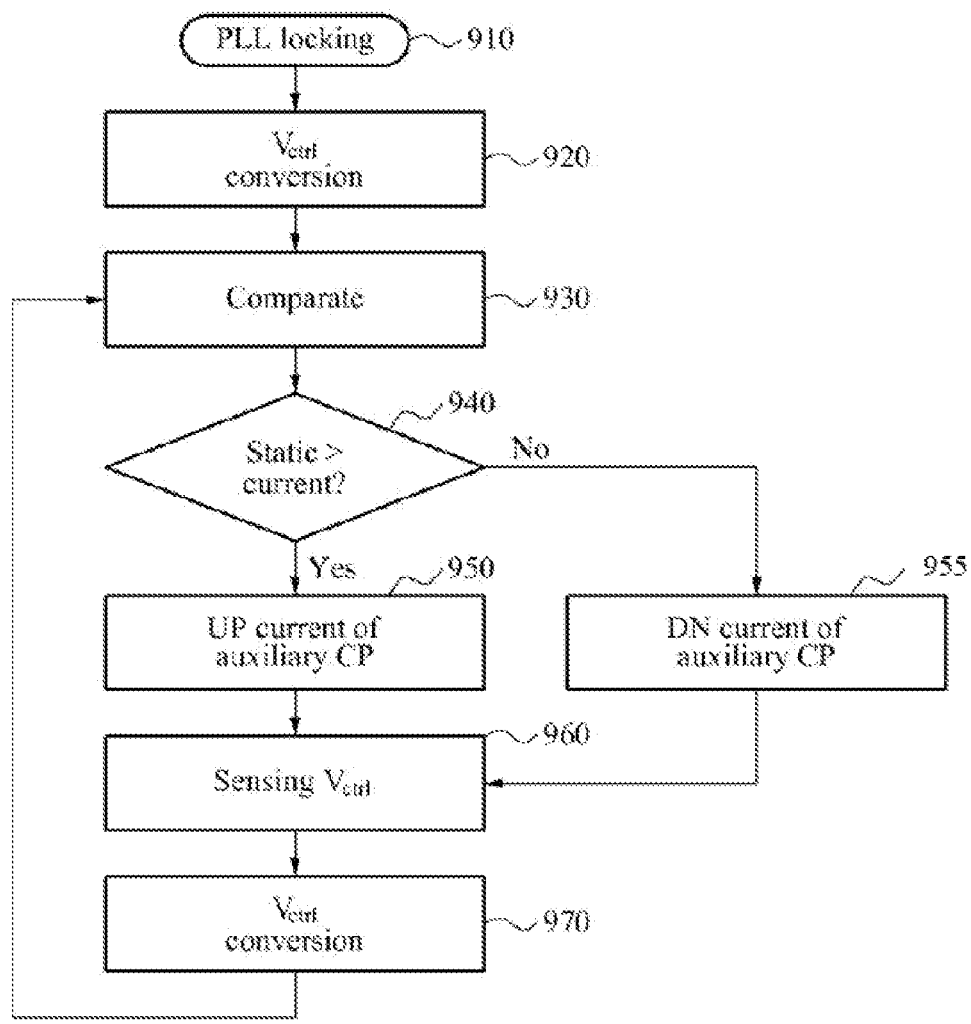
FIG. 9 is a flowchart illustrating an example of a control method for performing leakage compensation in a transceiver.

FIG. 9 illustrates an example of a control method for performing leakage compensation in a transceiver. Referring to FIG. 9, when a frequency of a PLL of the transceiver is locked (PLL locking), a PLL hold signal is converted from 0 to 1 and operation of the leakage compensation device is started in operation 910.

The leakage compensation device converts a control voltage $V_{ctrl}$ (determined when the frequency of the PLL is locked) using the comparator 561 in operation 920. However, other devices may be used depending on any particular embodiment. For example, an analog to digital converter (ADC) shown in FIG. 13 may be used instead of the comparator 561. In operation 920, the control voltage $V_{ctrl}$ is converted into the form of V_ctrl_dig<7:0>. V_ctrl_dig<7:0> refers to an 8 bit control voltage determined when a frequency of a PLL is locked.

In operation 930, the leakage compensation device compares an initial control voltage "static" (i.e., V_ctrl_dig<7:0>'s initial value) to a changed control voltage changed by leak "current" (i.e., a V_ctrl_dig<7:0>'s present state). Next, in operation 940, the leakage compensation device determines whether the initial control voltage (static) is higher than the changed control voltage changed by leak (current). In this example, the 'initial control voltage' refers to the control voltage when the operational frequency of the PLL is locked. For example, the 'initial control voltage' corresponds to a control voltage for a VCO latched at the time when the PLL converts from an on state to an off state. The 'changed control voltage' refers to the control voltage that is changed by the leakage when the PLL is turned off (e.g., according to turning off of an Rx RF part or a Tx RF part).

When operation 940 determines the initial control voltage is higher than the changed control voltage, the leakage compensation device generates an up (UP) current from an auxiliary CP, for example, the leakage compensation CP 565, in operation 950. Conversely, when operation 940 determines the initial control voltage is lower than the changed control voltage, the leakage compensation device generates a down (DW) current from the auxiliary CP, in operation 955. In this example, the control voltage may be compensated using the auxiliary CP to be increased using the UP signal or decreased using the DW signal.

The leakage compensation device detects a value of the compensated control voltage using a sensing capacitor in operation 960, and converts the compensated control voltage into a digital bit using a comparator in operation 970. The leakage compensation device may continually perform operations 930-970 to compensate for voltage leakage by having.

Figure 10:
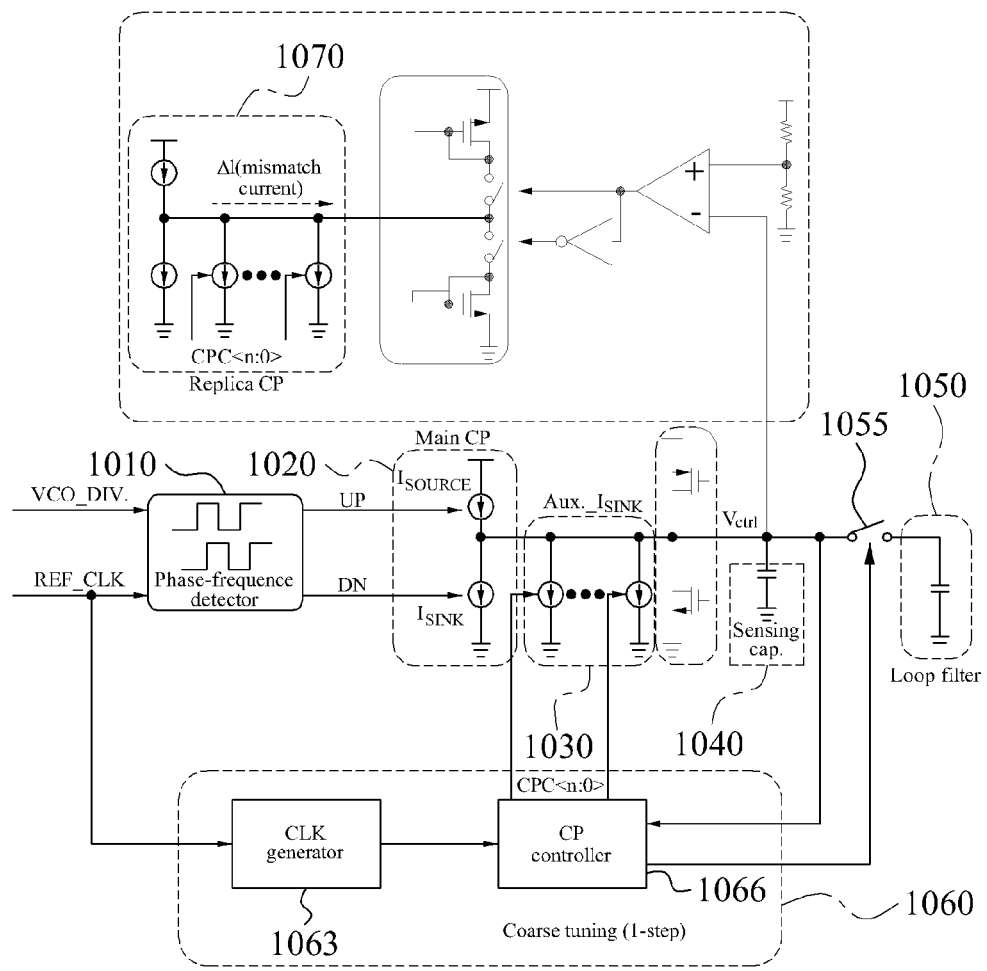
FIG. 10 is a diagram illustrating an example of a circuit operation of when first tuning for mismatch compensation is performed by a mismatch compensation device of the PLL of the transceiver.

FIG. 10 illustrates an example of operation of a circuit when a coarse tuning for mismatch compensation is performed by the mismatch compensation device of the PLL. Coarse tuning refers to coarse current compensation performed through discrete digital tuning Referring to FIG. 10, a first tuning device 1060 may perform the discrete digital tuning with respect to a current mismatch generated in a main CP 1020, by controlling a sink current Aux._$I_{SINK}$ for an auxiliary CP 1030 according to a detection result of a sensing capacitor 1040. That is, the first tuning device 1060 coarsely performs digital tuning using a CLK generator 1063 and a CP controller 1066. The CLK generator 1063 may provide the CP controller 1066 with a CLK supplied from outside of the PLL. The CP controller 1066 detects a voltage generated by the sensing capacitor 1040 and controls the auxiliary CP 1030 according to a detection result using a CPC<n:0> signal output from the CP controller 1066.

To prevent a capacitor and a resistor of a loop filter 1050 from being affected by the coarse tuning, the CP controller 1066 controls a switch 1055 to interrupt the connection between a control voltage $V_{ctrl}$ for a VCO and the loop filter 1050. In this example, the CPC<n:0> signal output from the CP controller 1066 also may be transmitted to a replica CP 1070. As a result, the voltage coarsely defined during the coarse tuning also may be recognized when fine tuning is performed.

According to one example, a source current $I_{SOURCE}$ applied to the main CP 1020 through a PFD 1010 may be designed to be higher than a sink current $I_{SINK}$. As a result, an initial voltage generated by the sensing capacitor 1040 is a high voltage or voltage drain drain (VDD).

Next, the CP controller 1066 detects the initial voltage, turns on one of current sources of the auxiliary CP 1030, and detects the voltage of the sensing capacitor 1040 again. Here, when the voltage of the sensing capacitor 1040 is decreased to ground (GND), that is, a low voltage, the operation of the first tuning device 1060 is complete.

Figure 11:
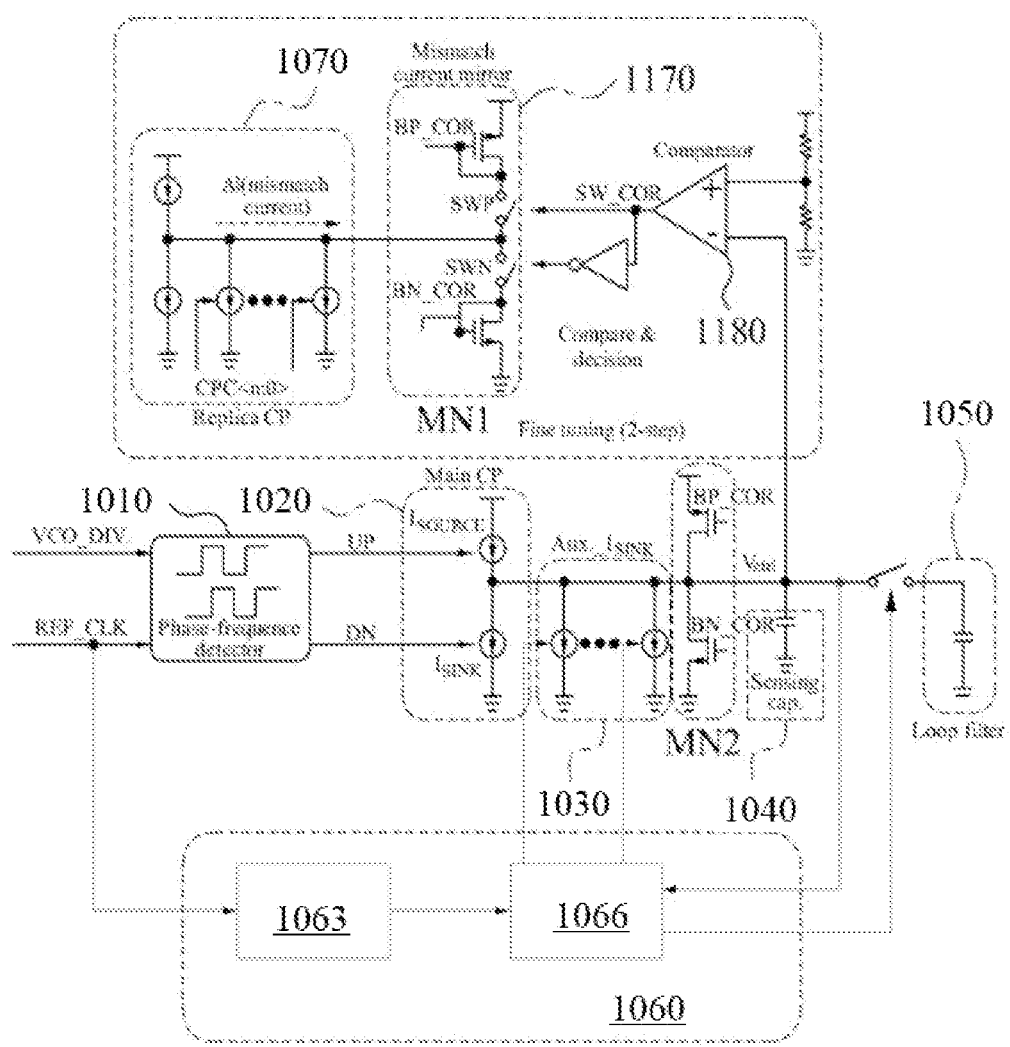
FIG. 11 is a diagram illustrating an example of a circuit operation of when second tuning for mismatch compensation is performed by a mismatch compensation device of the transceiver.

FIG. 11 illustrates an example of operation of a circuit when fine tuning for mismatch compensation is performed by a mismatch compensation device of the transceiver. Fine tuning refers to a process of compensating to supplement compensation by the coarse tuning.

Referring to FIG. 11, the CLK generator and the CP controller used for the coarse tuning are turned off, and the control voltage $V_{ctrl}$ for the VCO and the loop filter 1150 are reconnected.

In this example, the CPC<n:0> signal output from the CP controller 1066 also is transmitted to the replica CP 1070. Therefore, the voltage coarsely defined during the coarse tuning also is recognized when fine tuning is performed.

For example, when the source current $I_{SOURCE}$ applied to the main CP 1020 through the PFD 1010 is higher than the sink current $I_{SINK}$ during fine tuning, a sensing capacitor 1040 is charged with a mismatch current as much as ΔI, as shown in Equation 2.

$$\Delta I = I_{SOURCE} - I_{SINK} \quad \text{[Equation 2]}$$

A determination signal is an output signal of a comparator 1180, and the determination signal is applied to a mismatch current mirror 1170 as an input signal. When the voltages of opposite poles of the sensing capacitor 1040 are increased and compared by the comparator 1180, the resulting determination signal is output as 'LOW.' Accordingly, a switch SWN of the mismatch current mirror 1170 is turned on and a switch SWP of the mismatch current mirror 1170 is turned off. Therefore, the mismatch current, as much as ΔI, may flow to the current mismatch mirror 1170 (i.e., a circuit MN1).

The mismatch current may increase the sink current $I_{SINK}$ of the main CP 1120 by ΔI using a current mirror technique in which gates of the circuit MN1 and a circuit MN2_are interconnected, as shown in Equation 3. The mismatch current, as much as ΔI, may be transmitted to the main CP 1020, passing though the auxiliary CP 1030.

$$I_{SINK.COR} = I_{SINK} + \Delta I \quad \text{[Equation 3]}$$

After a time, the sink current $I_{SINK}$ becomes equal to the compensated sink current $I_{SINK.COR}$.

Figure 12:
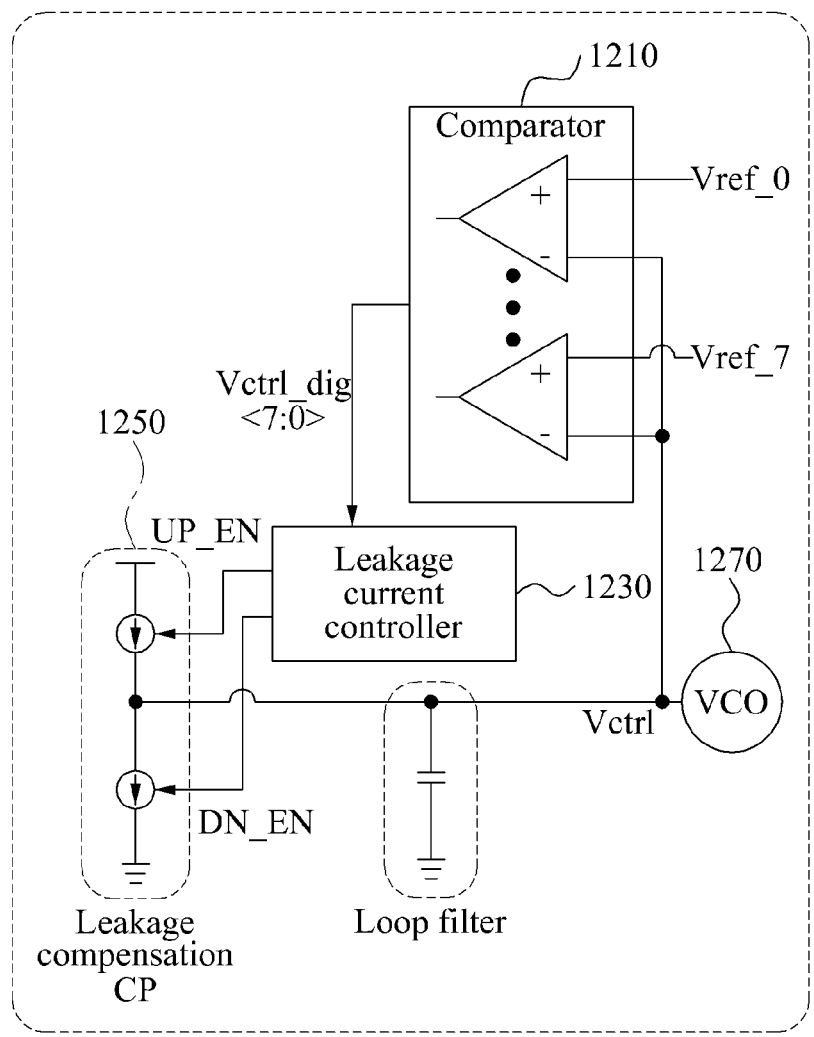
FIG. 12 is a diagram illustrating an example of a method of performing leakage compensation by a flash analog to digital conversion (ADC) technique by the leakage compensation device of the transceiver.

FIG. 12 illustrates an example of a method of performing leakage compensation by a flash ADC technique by the leakage compensation device of the transceiver.

Referring to FIG. 12, when a PLL of the transceiver locks to a frequency, the leakage compensation device may store a control voltage for a VCO 1270 in the form of Vctrl_dig<7:0>.

Next, when the PLL is turned off, the control voltage is changed. Accordingly, the leakage compensation device receives the changed control voltage and compares the changed control voltage with a value stored during PLL locking using a comparator 1210.

Based on a comparison result of the comparator 1210, a leakage current controller 1230 generates a control voltage with respect to a leakage compensation CP configured to compensate for leaking charges. That is, the leakage current controller 1230 maintains a control voltage $V_{ctrl}$ for the VCO 1270 by controlling a control voltage for the leakage compensation CP, for example, using an UP_EN signal and a DN_EN signal.

For example, assuming that a control voltage $V_{ctrl}$ during frequency locking of the PLL (PLL Lock) is 0.6V and the signal Vctrl_dig<7:0>(1) output from the comparator 1210 is "10000000" in binary format, when the control voltage is reduced to about 0.5V, the signal Vctrl_dig<7:0>(2) output from the comparator 1210 is "01001000" in binary format. Comparing the output signals from the comparator 1210, Vctrl_dig<7:0>(2) is less than Vctrl_dig<7:0>(1). Therefore, the leakage current controller 1230 comparing the output signals outputs an EN signal UP_EN to be high, thereby compensating for the control voltage Vctrl for the VCO 1270.

Figure 13:
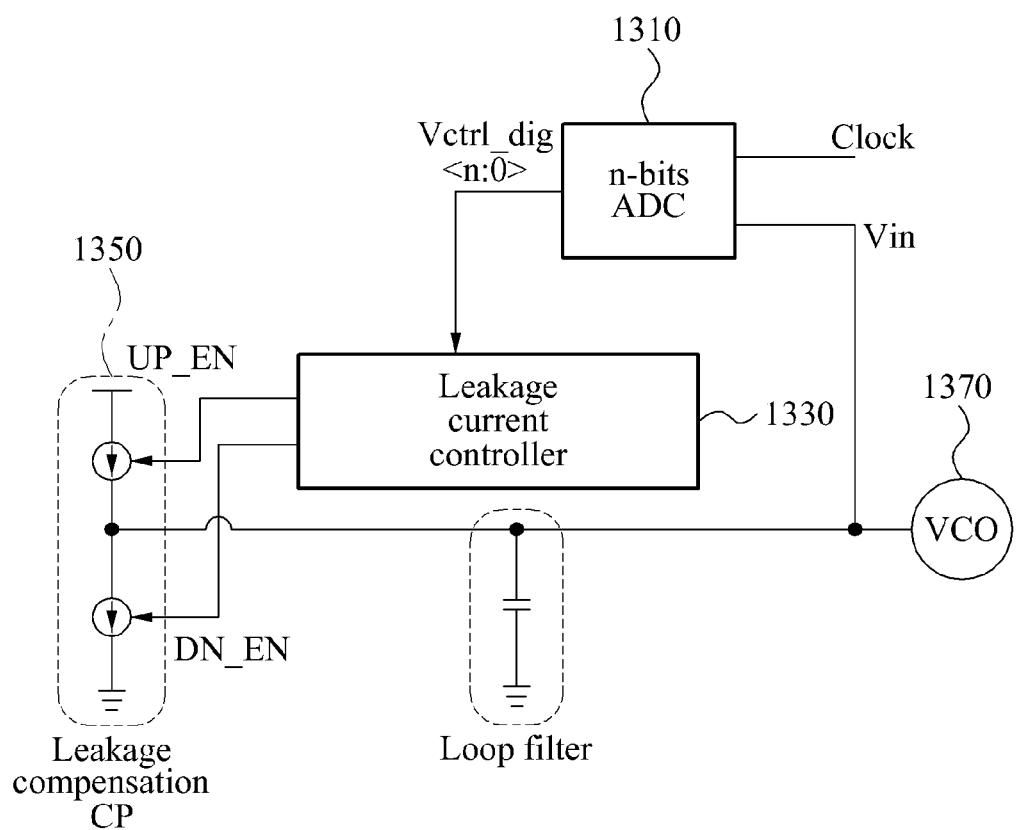
FIG. 13 is a diagram illustrating an example of a leakage compensation device configured using a successive approximation analog to digital converter (SAR ADC) in a transceiver.

FIG. 13 illustrates an example of a leakage compensation device configured using a successive approximation (SAR) analog-to-digital converter (ADC) in a transceiver.

The leakage compensation device may include an ADC 1310, a leakage current controller 1330, and a leakage compensation CP 1350. The ADC 1310 generates a digital signal based on a difference between a locked control voltage and a changed control voltage. The leakage current controller 1330 generates a control voltage with respect to the leakage compensation CP 1350 that compensates for leaking charges based on the digital signal generated in the ADC 1310.

The leakage compensation device may control resolution of the ADC 1310 when a PLL is in an off state, thereby controlling the control voltage for a VCO 1370. When the control voltage is already known, the control voltage may be maintained by performing compensation using only the ADC 1310 without the PLL. Here, the resolution of the ADC 1310 may be selected so that a frequency change of the VCO 1370 according to control of the control voltage is performed in units of hertz (Hz).

Figure 14:
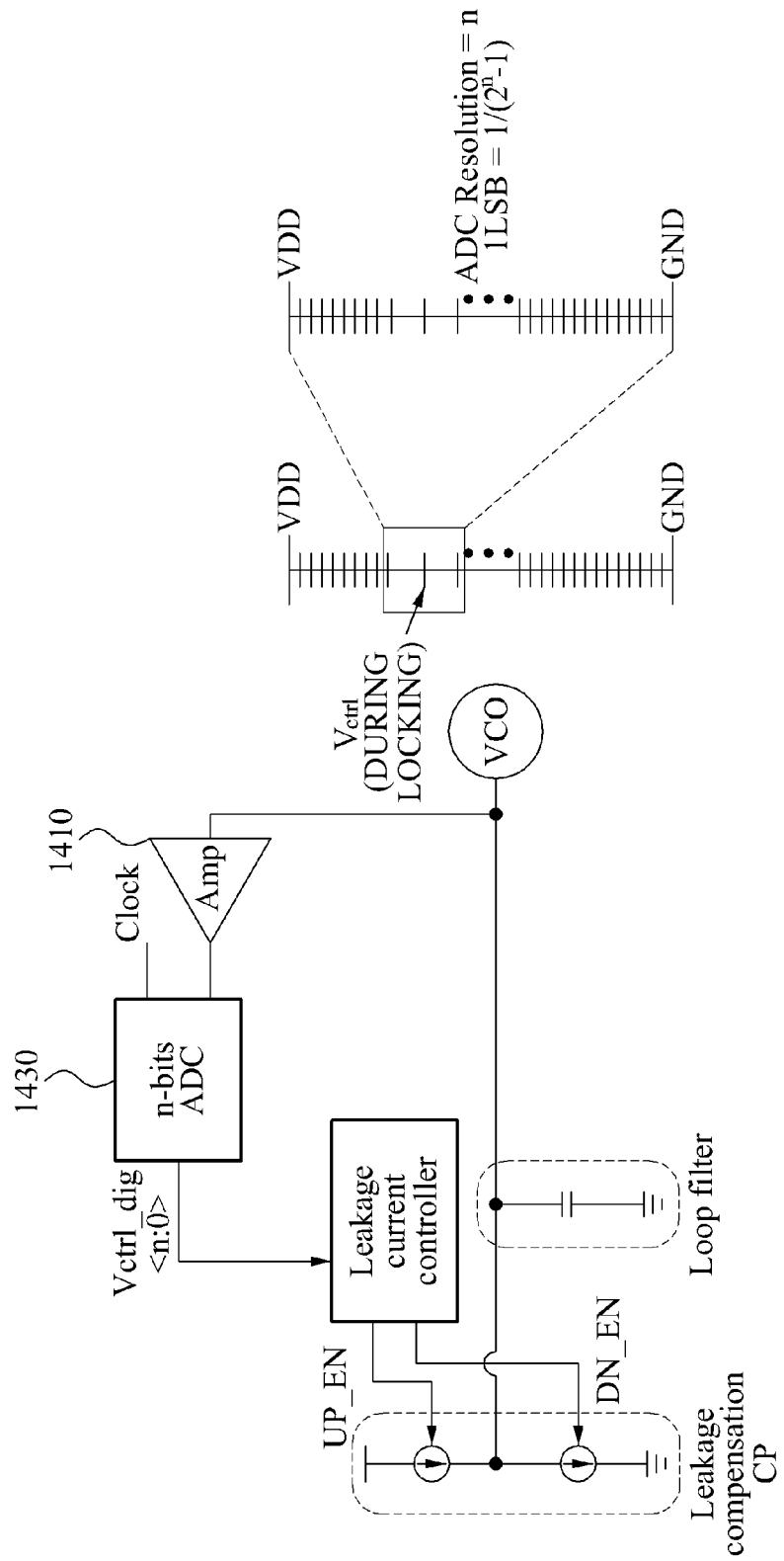
FIG. 14 is a diagram illustrating an example of a method of controlling a locked control voltage $V_{CTRL}$ for a voltage controlled oscillator (VCO) in a leakage compensation device of a transceiver.

FIG. 14 illustrates an example of a method of controlling a control voltage $V_{CTRL}$ for a VCO in a leakage compensation device of a transceiver. According to this example, a control voltage is found after frequency locking by a PLL, and a proper period according to the control voltage is amplified by an amplifier 1410. Therefore, with respect to a same resolution of an ADC 1430, efficiency of compensation for a control voltage for a VCO is increased.

In a case, resolution of the ADC=n and 1LSB=$1/(2^n-1)$. In one example, in which an 8 bit ADC resolution is set for a full range of the control voltage, the resolution becomes 1LSB=$1/(2^8-1)$=3.9 mV. However, for example, when an amplification period of 0.1V is set up and down, respectively, with respect to the control voltage $V_{CTRL}$ of 0.6V, the total amplification period is 0.2V. Here, when 8 bits are used, the resolution becomes 1LSB=$0.2/(2^8-1)$=0.784 mV.

Figure 15:
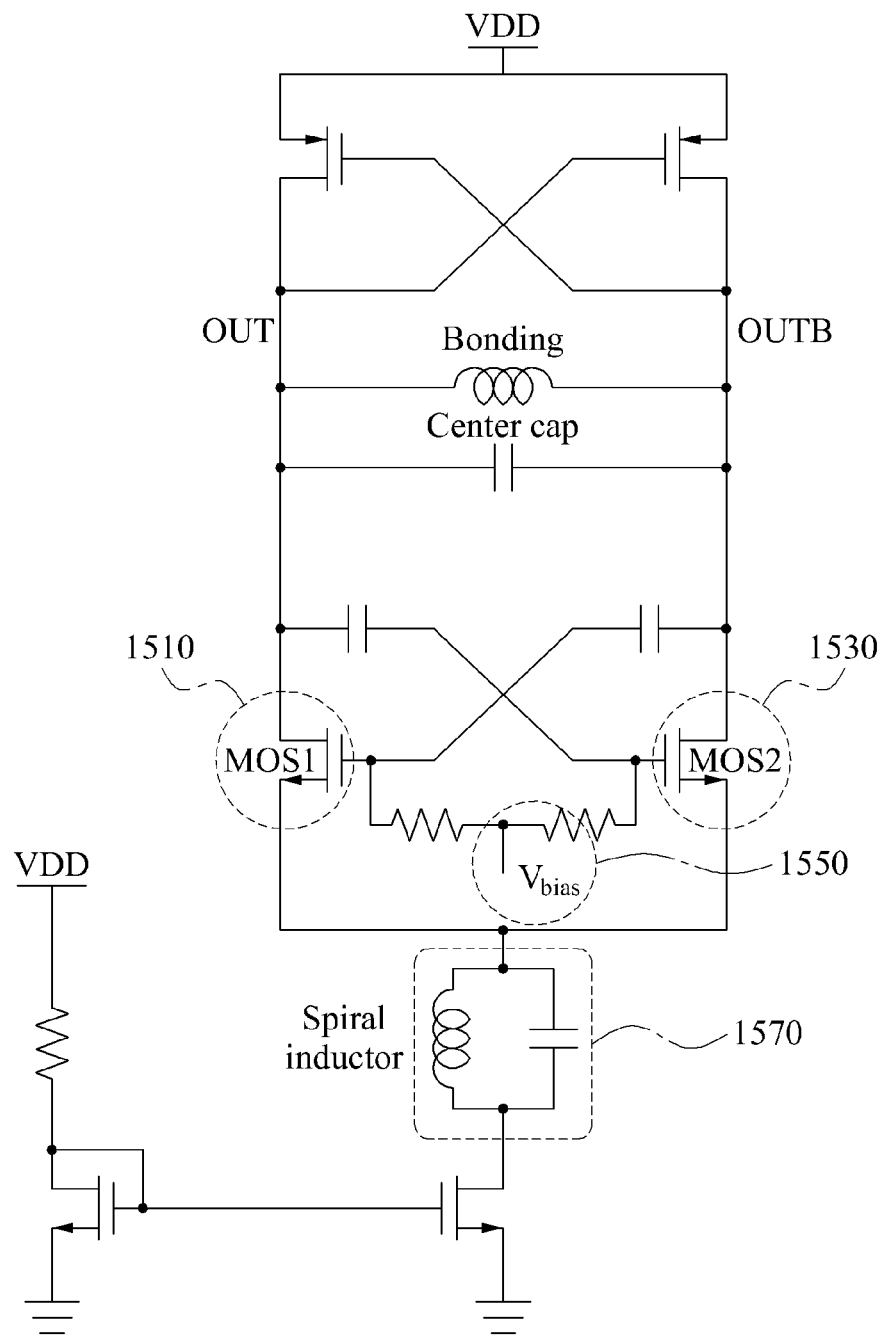
FIG. 15 is a diagram illustrating an example of a VCO of a transceiver.

FIG. 15 illustrates an example of a VCO of a transceiver. Referring to FIG. 15, a low phase noise class-C type VCO is illustrated, which is appropriate for turning off a PLL. For example, the VCO of the transceiver may include a class-C type VCO including an LC tank 1570.

In case of the class-C type, an operating point is controlled to be less than about 180°, by applying a bias voltage 1550 to metal oxide semiconductor field effect transistors (MOSFETs) 1510 and 1530. Consequently, current consumption is reduced.

In addition, according to the embodiment, the LC tank 1570 may be added to a tail current source. Therefore, flicker noise may be effectively removed by a filtering effect of this placement. Furthermore, since the PLL is turned off by the LC tank 1570, phase noise characteristics are increased even during sole operation of the VCO.

Figure 16:
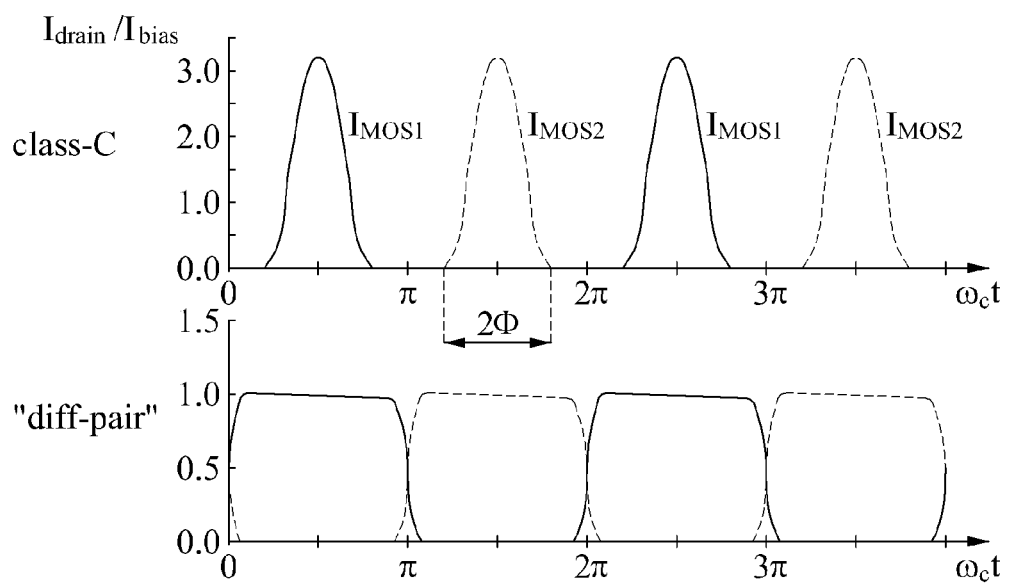
FIG. 16 is a diagram illustrating an example of phase noise characteristics of the VCO shown in FIG. 15.

FIG. 16 illustrates an example of phase noise characteristics of the VCO shown in FIG. 15. Referring to FIG. 16, the VCO changes the operating point by controlling the bias current 1550, which is different from other differential type VCOs. Therefore, while current consumption is minimized, swing may be increased.

Figure 17:
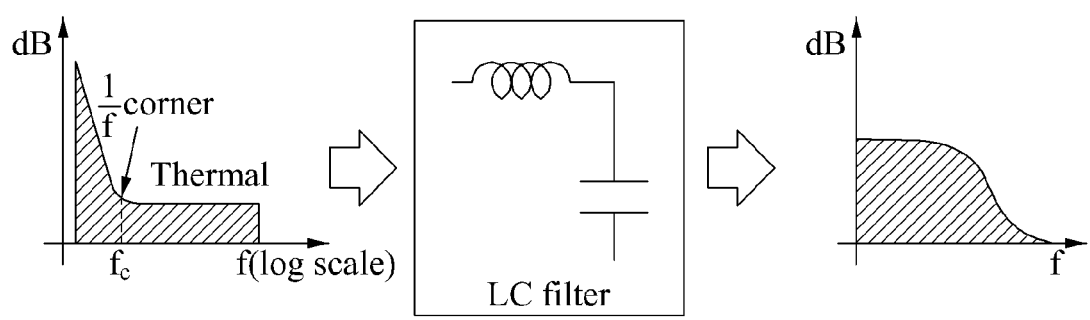
FIG. 17 is a diagram illustrating an example in which a flicker noise is reduced by an inductor capacitor (LC) tank included in the VCO shown in FIG. 15.

FIG. 17 illustrates an example in which a flicker noise is reduced by the LC tank 1570. Referring to FIG. 17, when a frequency axis is used to indicate noise generated inside an active device, the flicker noise abruptly increases at a low frequency. Generally, when the frequency is decreased to about 100 Hz or less, the noise inside of the active device is greatly increased, and although such noise generated at the low frequency may not be influential in a high frequency circuit, an oscillator, such as the VCO may be greatly influenced by the noise. Ideally, the oscillator has a sharp waveform on a desired frequency on a spectrum. However, an actual waveform may be a slightly pointed mountain rather than the sharp waveform that abruptly slopes down toward a side from an oscillation frequency, as shown in a left graph of FIG. 17.

In this case, the phase noise is an indicator of a degree of the down slope to check whether the oscillator oscillates only at the desired frequency. The flicker noise is the main reason that the waveform does not sharply fall with respect to a middle frequency but rather slopes down. The flicker noise is a unique noise of the active device. The flicker noise may also be called "1/f noise" because the noise is inversely proportional to the frequency. Therefore, according to the example provided herein, the flicker noise may be removed using an LC tank (i.e., an LC filter including an inductor L and a capacitor C) such as LC tank 1570 so that the noise factor is reduced. Accordingly, the phase noise may be improved as shown in the right graph of FIG. 17.

The inductor L of the LC tank may be an inductor with an increased quality factor Q. The quality factor Q of the inductor L is largely increased through control of the lengths of a plurality of the lead pins and components of a board trace, a surface area of a closed loop formed by the components, and the like.

Figure 18:
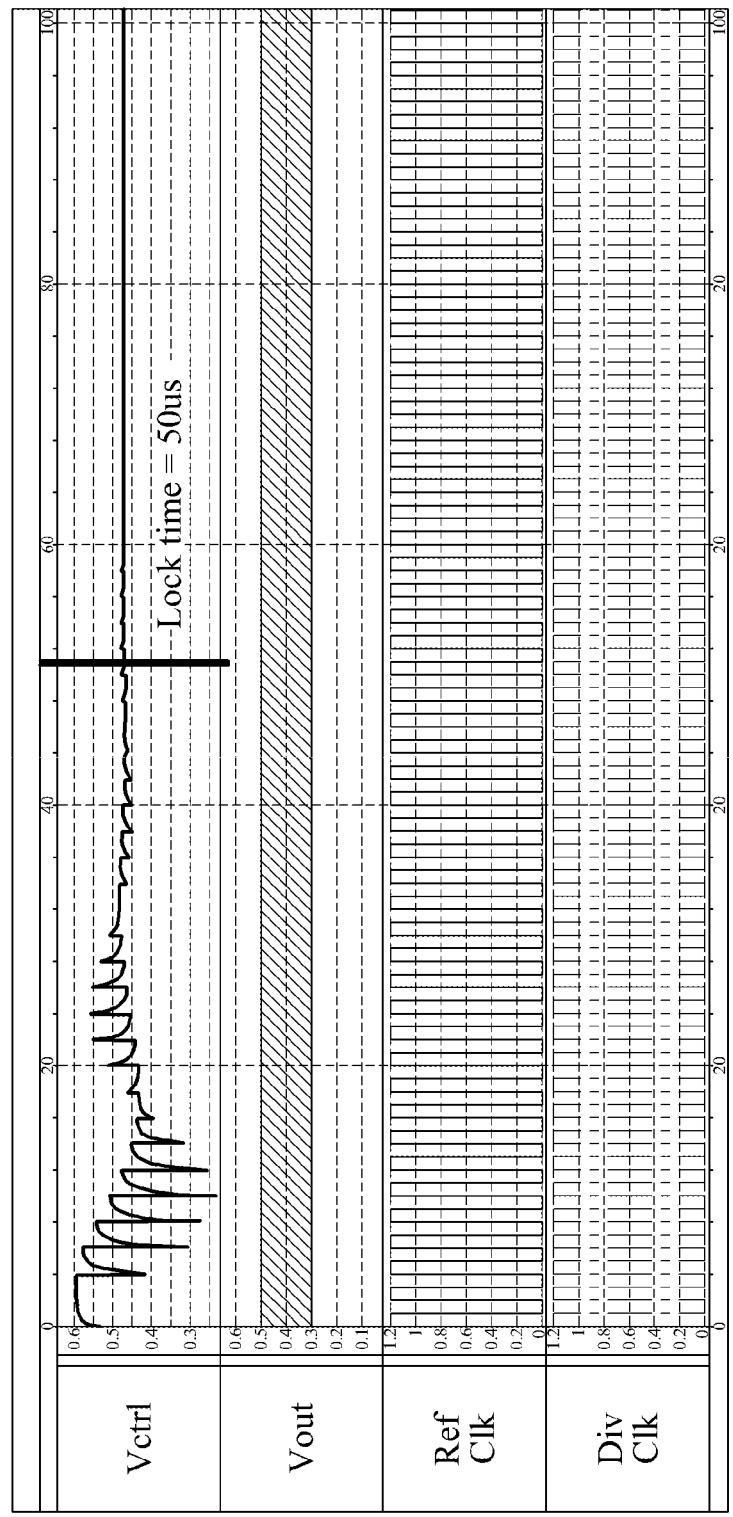
FIG. 18 is a graph illustrating an example result of simulation of a lock time of a PLL included in a transceiver.

FIG. 18 illustrates an example of simulated result of a lock time of a PLL included in a transceiver according to the examples herein. Referring to FIG. 18, a lock time of the PLL of the transceiver is approximately 50 us, which is smaller than a lock time of a general PLL which is approximate 100 us.

In addition, one will appreciate that a control voltage Vctrl of the PLL becomes uniform after frequency locking.

Figure 19:
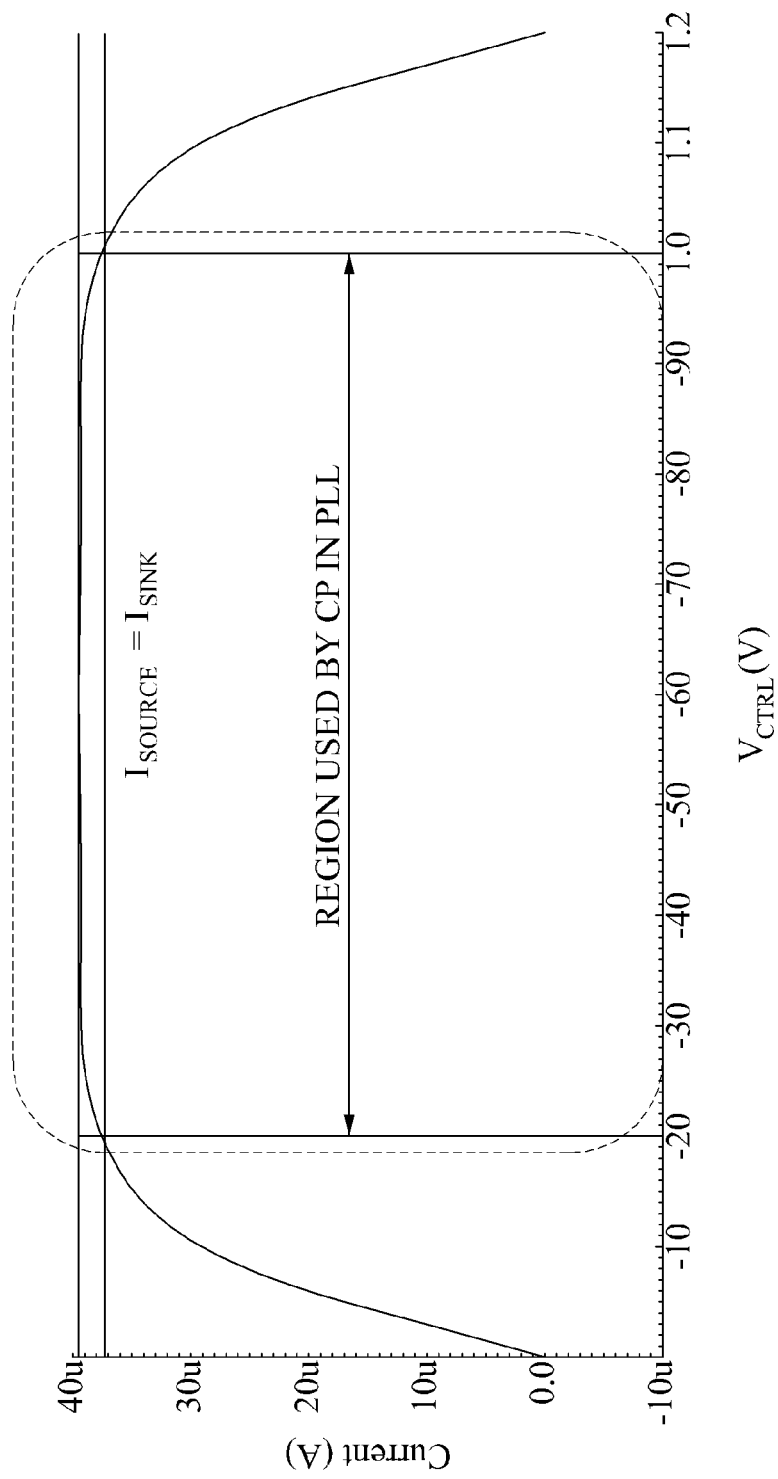
FIG. 19 is a graph illustrating an example result of simulation of relationships between a locked control voltage $V_{CTRL}$ and a current of when a mismatch does not occur in a PLL included in a transceiver.

FIG. 19 illustrates an example of a simulated result of relationships between a locked control voltage $V_{CTRL}$ and a current of when a mismatch does not occur in a PLL included in a transceiver. Referring to FIG. 19, when the mismatch does not occur in a main CP of the PLL, a source current $I_{SOURCE}$ and a sink current $I_{SINK}$ are equal.

Figure 20:
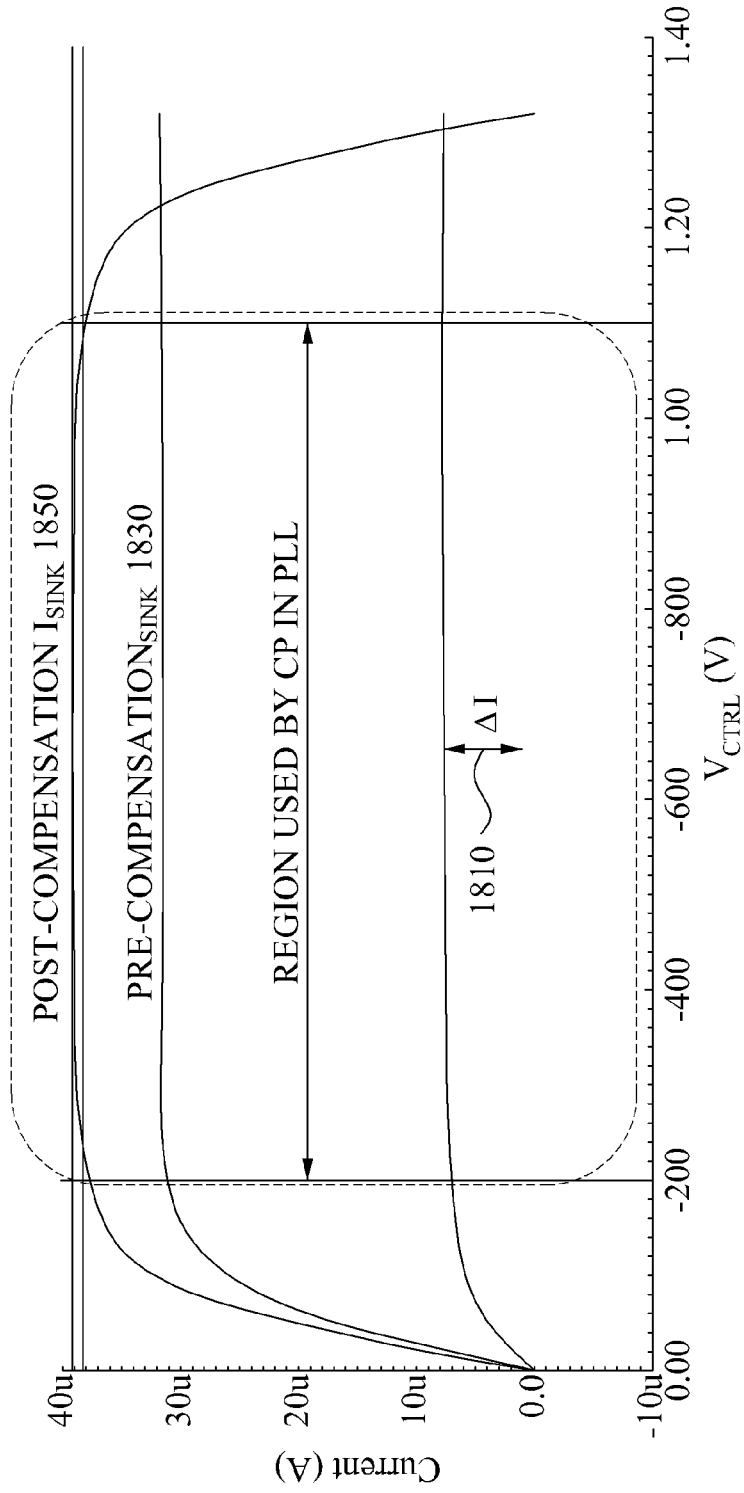
FIG. 20 is a graph illustrating an example in which a sink current becomes lower than a source current ($I_{SOURCE} > I_{SINK}$) due to a mismatch generated in a PLL included in a transceiver.

FIG. 20 illustrates an example in which the sink current becomes lower than a source current ($I_{SOURCE} > I_{SINK}$) due to a mismatch generated in a PLL included in a transceiver. Referring to FIG. 20, when the sink current $I_{SINK}$ is decreased to a pre-compensation sink current $I_{SINK}$ 1830, for example, due to the mismatch generated in a main CP of the PLL, the PLL may compensate for a current ΔI 1810 corresponding to the mismatch, thereby obtaining a post-compensation sink current $I_{SINK}$ 1850 which is almost equal to the source current $I_{SOURCE}$. In this example, the post-compensation sink current $I_{SINK}$ 1850=the pre-compensation sink current 1830+the current ΔI 1810 corresponding to the mismatch=the source current $I_{SOURCE}$ is satisfied. The current ΔI 1810 corresponding to the mismatch may be obtained by subtracting the sink current $I_{SINK}$ from the source current $I_{SOURCE}$.

Figure 21:
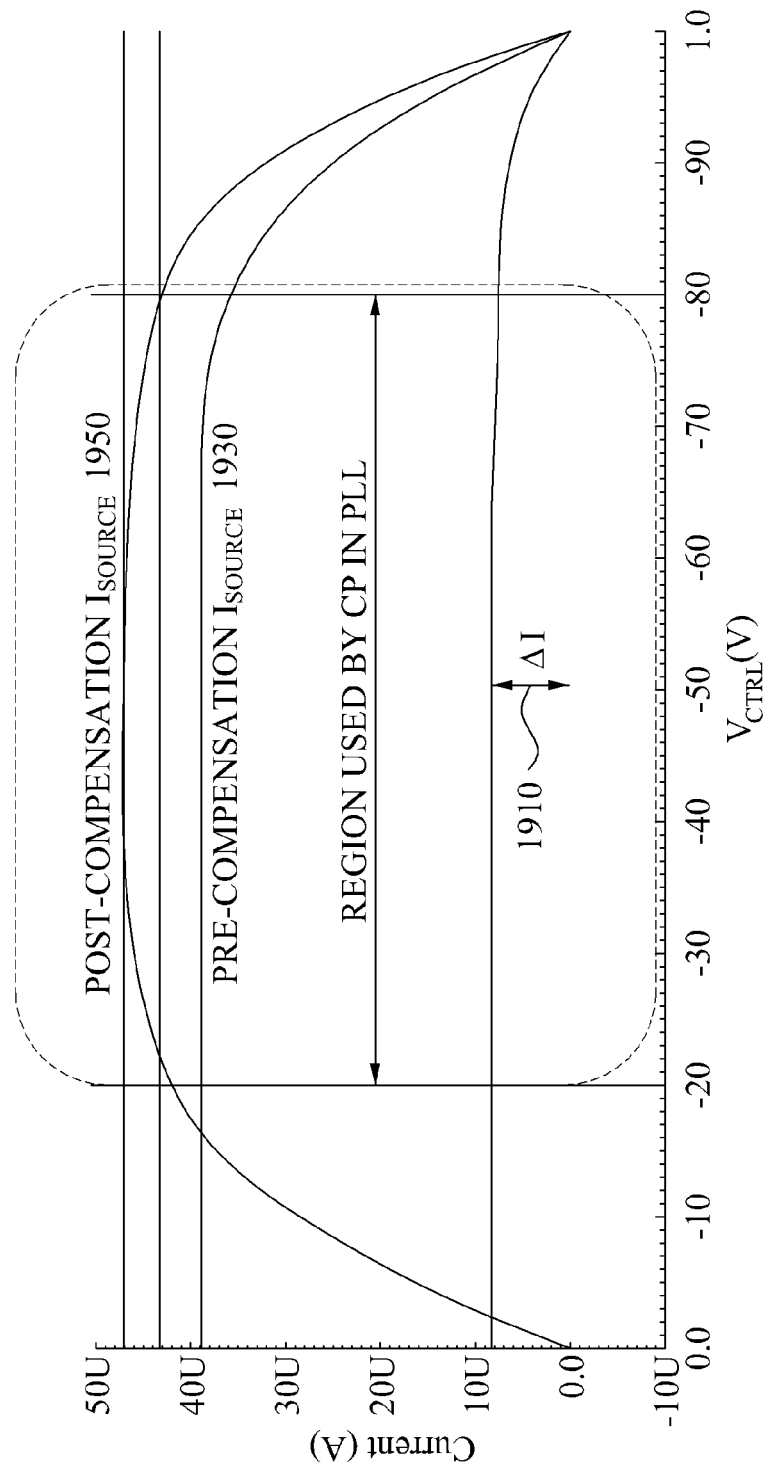
FIG. 21 is a graph illustrating an example in which a source current becomes lower than a sink current ($I_{SOURCE} < I_{SINK}$) due to a mismatch generated in a PLL included in a transceiver.

FIG. 21 illustrates an example in which the source current becomes lower than a sink current (i.e., $I_{SOURCE}<I_{SINK}$) due to a mismatch generated in a PLL included in a transceiver. Referring to FIG. 21, when the source current is decreased to a pre-compensation source current 1930 due to a mismatch generated in a main CP of the PLL, the PLL may compensate for a current ΔI 1910 corresponding to the mismatch, and there obtain a post-compensation source current $I_{SOURCE}$ 1950 that is almost equal to the sink current $I_{SINK}$. In other words, the post-compensation sink current $I_{SINK}$ 1950=pre-compensation sink current 1930+current ΔI 1910 corresponding to the mismatch=sink current $I_{SINK}$ is satisfied. The current ΔI 1910 corresponding to the mismatch may be obtained by subtracting the source current $I_{SOURCE}$ from the sink current $I_{SINK}$.

Figure 22:
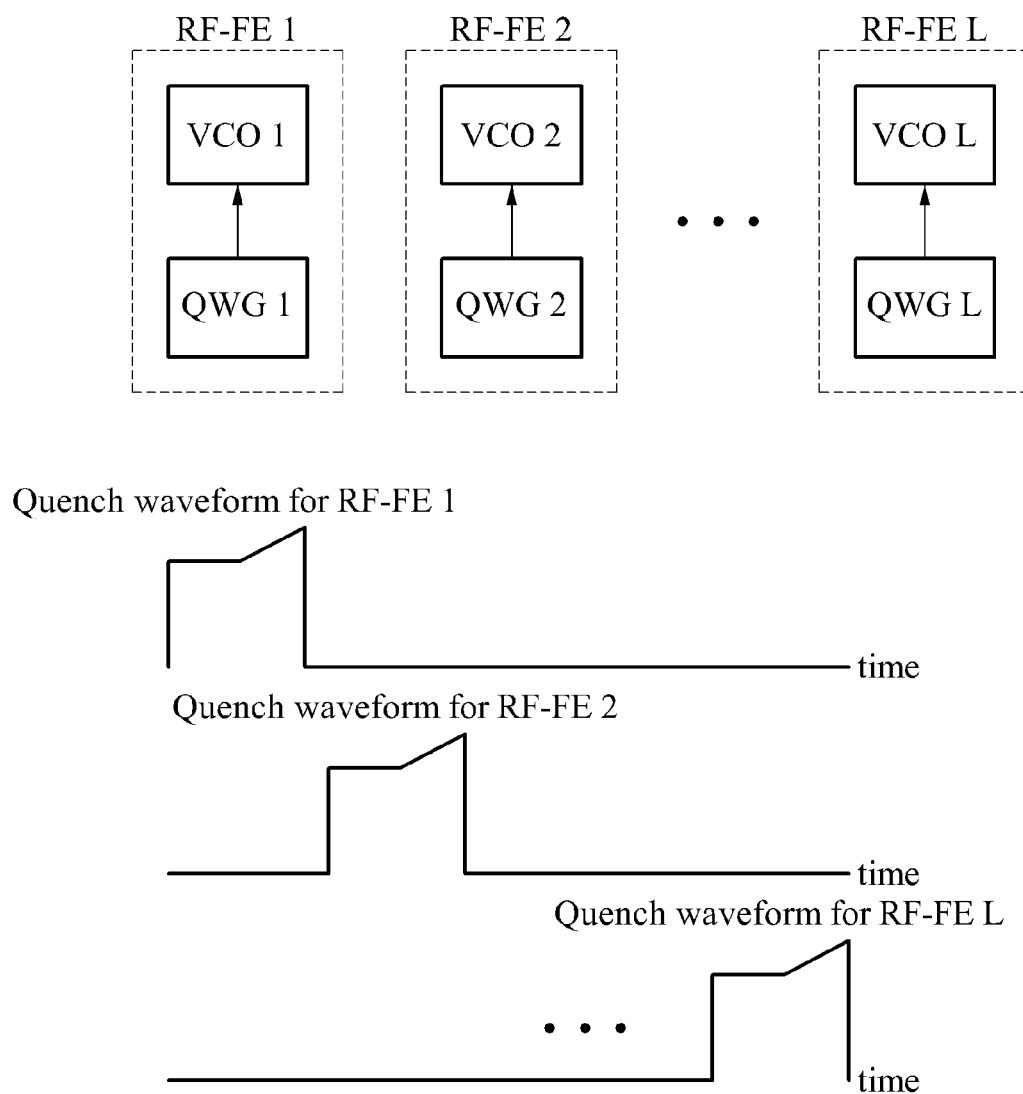
FIG. 22 is a diagram illustrating an example operation of a transceiver including a plurality of VCOs and a plurality of quenching waveform generators (QWGs).

FIG. 22 illustrates an example of operation of a transceiver including a plurality of VCOs and a plurality of quenching waveform generators (QWGs). Referring to FIG. 22, a plurality of RF-front ends (FEs) each include a QWG and a VCO. The RF-Fes are commonly used in a Tx RF part and an Rx RF part, for example, the transceiver may include at least two RF-FEs. In one example, assume that an RF-FE 1 is a transmission part and an RF-FE 2 is a reception part. The transceiver also may include a first QWG 1, a second QWG 2, a first VCO 1, and a second VCO 2. The first QWG 1 controls a quenching waveform of a first RF part, that is, the RF-FE 1. The second QWG 2 controls a quenching waveform of a second RF part, that is, the RF-FE 2. The first VCO 1 and the second VCO 2 operate at the same frequency and operate according to the generated the quenching waveforms of the RF-FE 1 and the RF-FE 2, respectively. The quenching waveforms are generated by the first QWG 1 and the second QWG 2 to control the first VCO 1 and the second VCO 2 such that the quenching waveforms do not overlap.

In this example, a guard time may be set between the quenching waveform for the first RF-FE 1 and the quenching waveform for the second RF-FE 2 to prevent an output of the first VCO 1 from interfering with an output of the second VCO 2. The guard time is described below in further detail with reference to FIG. 23.

In addition, the transceiver including the two RF-FEs, for example, the first RF-FE 1 and the second RF-FE 2, also may include one or more antennas.

When the transceiver includes a single antenna, the first QWG controls the quenching waveform of the first RF part of the single antenna, while the second QWG controls the quenching waveform of the second RF part of the single antenna.

When the transceiver includes a plurality of antennas, for example, a first antenna and a second antenna, the first QWG controls the quenching waveform of the first RF part corresponding to the first antenna, while the second QWG controls the quenching waveform of the second RF part corresponding to the second antenna.

The QWGs included in the plurality of RF-FEs determine an operation timing of the plurality of VCOs through quenching waveforms that are temporally separated, so that the plurality of VCOs oscillate at different times, respectively. The first QWG 1 in the first RF-FE controls a current input to the first VCO 1 to control its oscillation. For example, the first QWG 1 controls a bias current of the first VCO 1. The first VCO 1 oscillates when the bias current is greater than or equal to a critical current. However, the first VCO 1 does not oscillate when the bias current is less than the critical current.

According to the example shown in FIG. 22, the transceiver may include an L-number of Rx RF parts and Tx RF parts, and at least an L-number of antennas. In this example, the first QWG included in the first RF part corresponding to a first antenna controls a quenching waveform of a first Tx RF part and a quenching waveform of a first Rx RF part corresponding to the first antenna.

The second QWG included in the second RF part corresponding to the second antenna controls a quenching waveform of a second Tx RF part and a quenching waveform of a second Rx RF part corresponding to the second antenna.

Here, the respective quenching waveforms are generated to control a plurality of VCOs operating at the same frequency. The quenching waveforms generated by the first QWG and the second QWG to control the plurality of VCOs are generated such that the quenching waveforms do not overlap.

Figure 25:
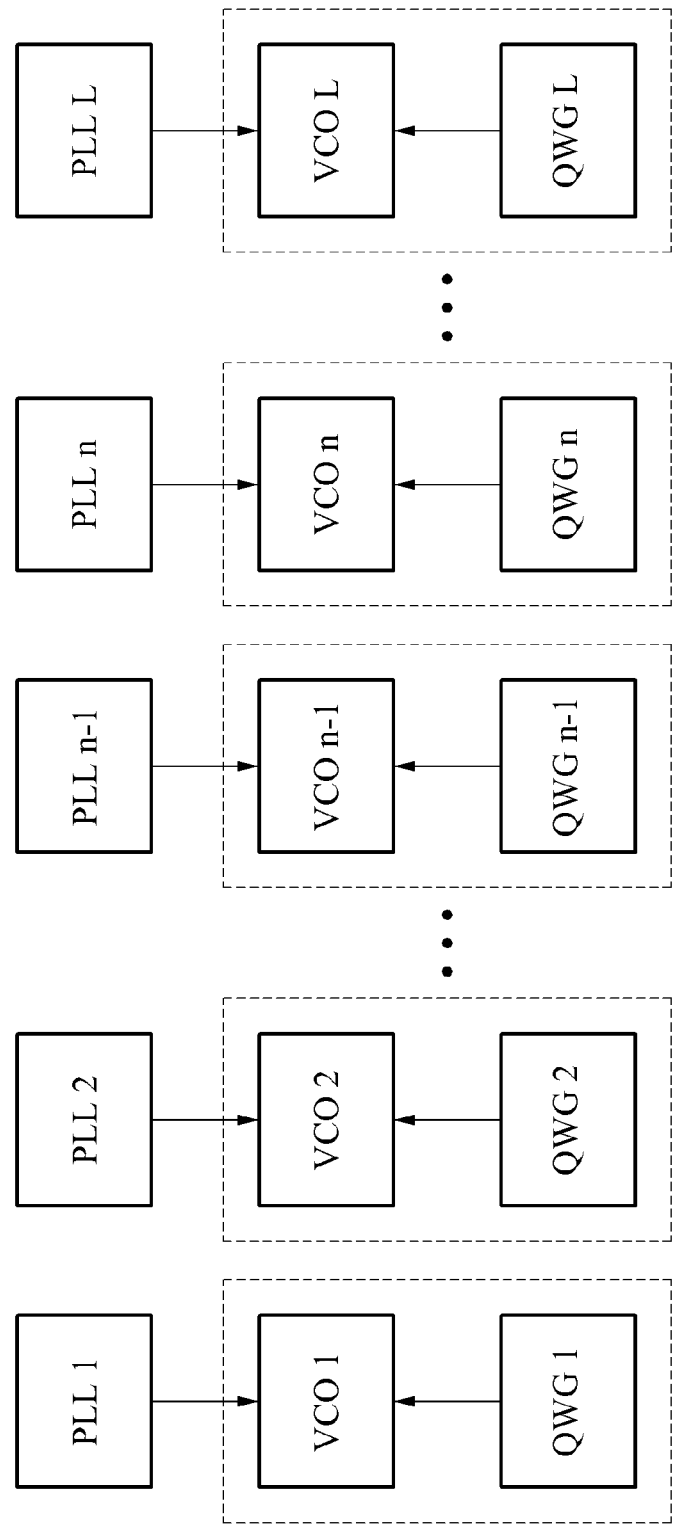
FIG. 25 is a diagram illustrating an example of a transceiver including a plurality of PLLs, a plurality of VCOs, and a plurality of QWGs.
Figure 26:
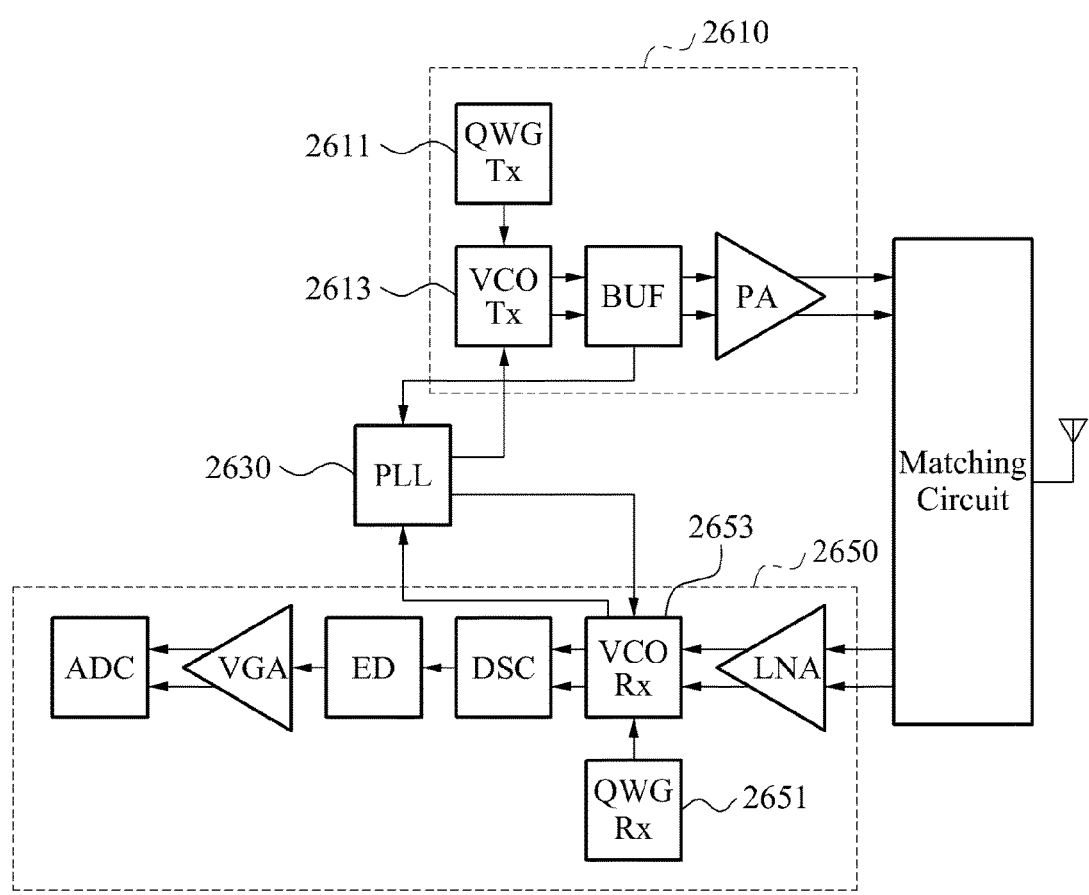
FIG. 26 is a diagram illustrating an example of a transceiver in which a transmission RF part and a reception RF part of a transceiver.

The VCOs, for example, VCO 1, VCO 2, . . . , VCO L may be controlled by different corresponding PLLs and QWGs, respectively, as shown in FIG. 25. In addition, the VCOs: VCO 1, VCO 2, . . . , and VCO L may be controlled by respective corresponding QWGs and a shared PLL as shown in FIG. 26. In these examples, the VCOs may be implemented using a super regenerative oscillator (SRO).

The QWGs: QWG 1, QWG 2, . . . , and QWG L may generate quenching waveforms for RF-Fes: RF-FE 1, RF-FE 2, . . . , and RF-FE N such that the quenching waveforms do not overlap, as shown in a lower timing diagrams of FIG. 22, and to prevent interference among the plurality of VCOs.

Figure 23:
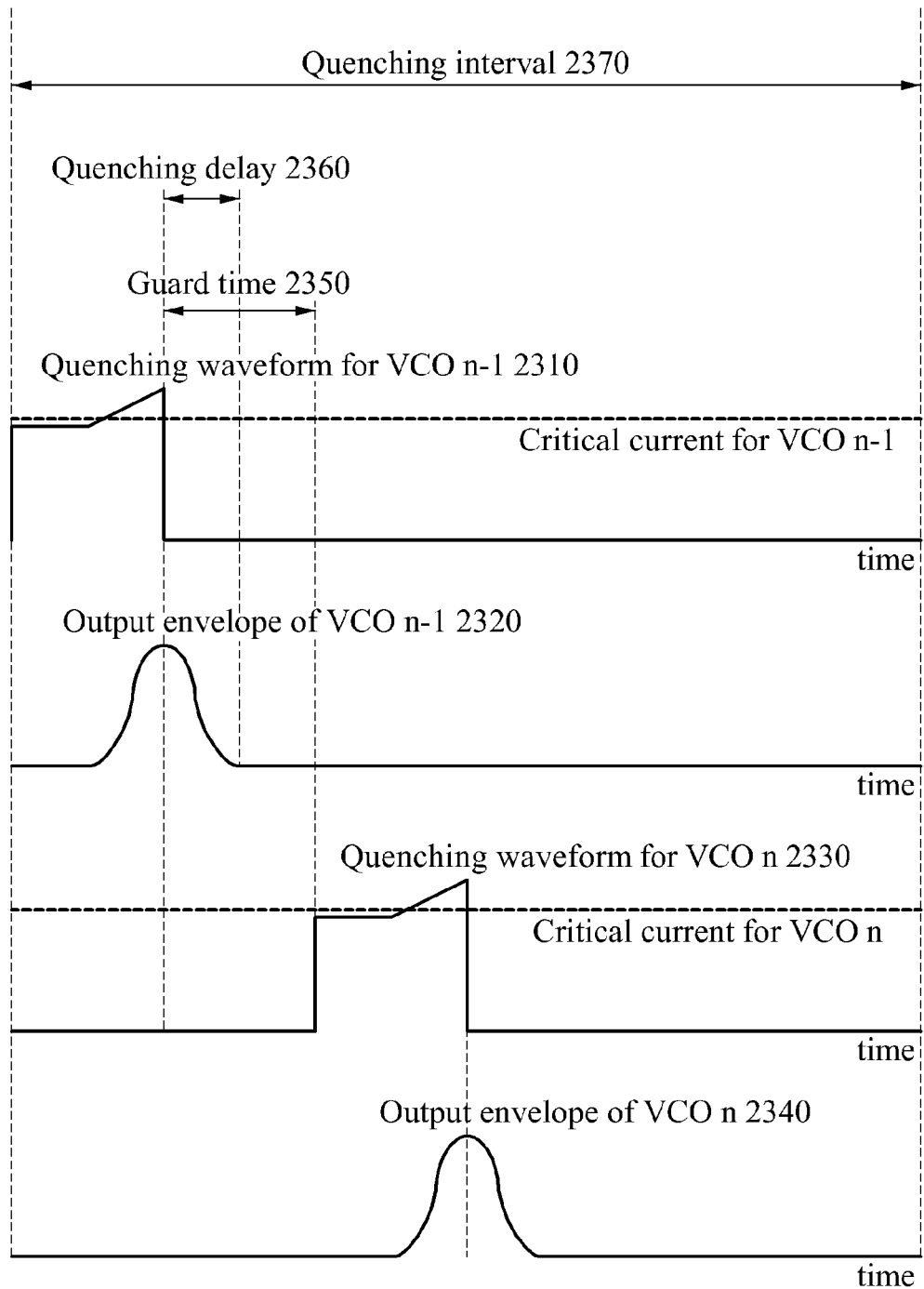
FIG. 23 is a diagram illustrating an example of non-overlapped quenching waveforms applied to a plurality of VCOs and corresponding output envelopes.

FIG. 23 illustrates an example of non-overlapped quenching waveforms applied to a plurality of VCOs to generate corresponding output envelopes. A plurality of QWGs may each generate non-overlapped quenching waveforms that are applied to corresponding VCOs. The VCOs receiving the non-overlapped quenching waveforms generate output envelopes that do not overlap.

As shown in FIG. 23, a quenching waveform 2310 with respect to a VCO n-1 denotes a signal that controls an operating time of the VCO n-1. A quenching waveform 2330 with respect to a VCO n denotes a signal that controls an operating time of the VCO n.

In this example, the quenching waveforms 2310 and 2330 are designed with respect to the VCOs such that the VCOs do not oscillate simultaneously. Consequently, interference that would be generated among a plurality of oscillators simultaneously operating is prevented.

The quenching waveform 2310 and the quenching waveform 2330 are signals controlling the VCO n-1 and the VCO n to sequentially operate. A guard time 2350 may be set between the quenching waveforms. The guard time 2350 refers to a time interval where an output of any one VCO among the plurality of VCOs is prevented from interfering with an output of another VCO. For example, the guard time 2350 may be a guard section to prevent an output of the VCO n-1 from interfering with an output of the VCO n. In this example, the guard time 2350 is chosen to be certainly greater than a quenching delay 2360 generated while an output envelope 2320 dissipates corresponding to the discharge of the VCO. Therefore, interference is prevented that would occur when the output envelope of the VCO n-1 is transmitted overlapping with an oscillation section of the VCO n.

As shown in FIG. 23, a quenching interval 2370 may be determined as follows.

Assuming that the total number of VCOs is L, when all L-number of VCOs finish operation sequentially, operation of a VCO 1 may be repeated. Here, the time during which all of the L-number of VCOs sequentially finish operation through operational control is determined as the quenching interval 2370.

In this example, the L-number of VCOs may be controlled by the L-number of quenching waveforms to oscillate sequentially. Therefore, independent operation among the plurality of oscillator output signals may be guaranteed. Accordingly, a multipath gain may be secured without interference between oscillators.

Figure 24:
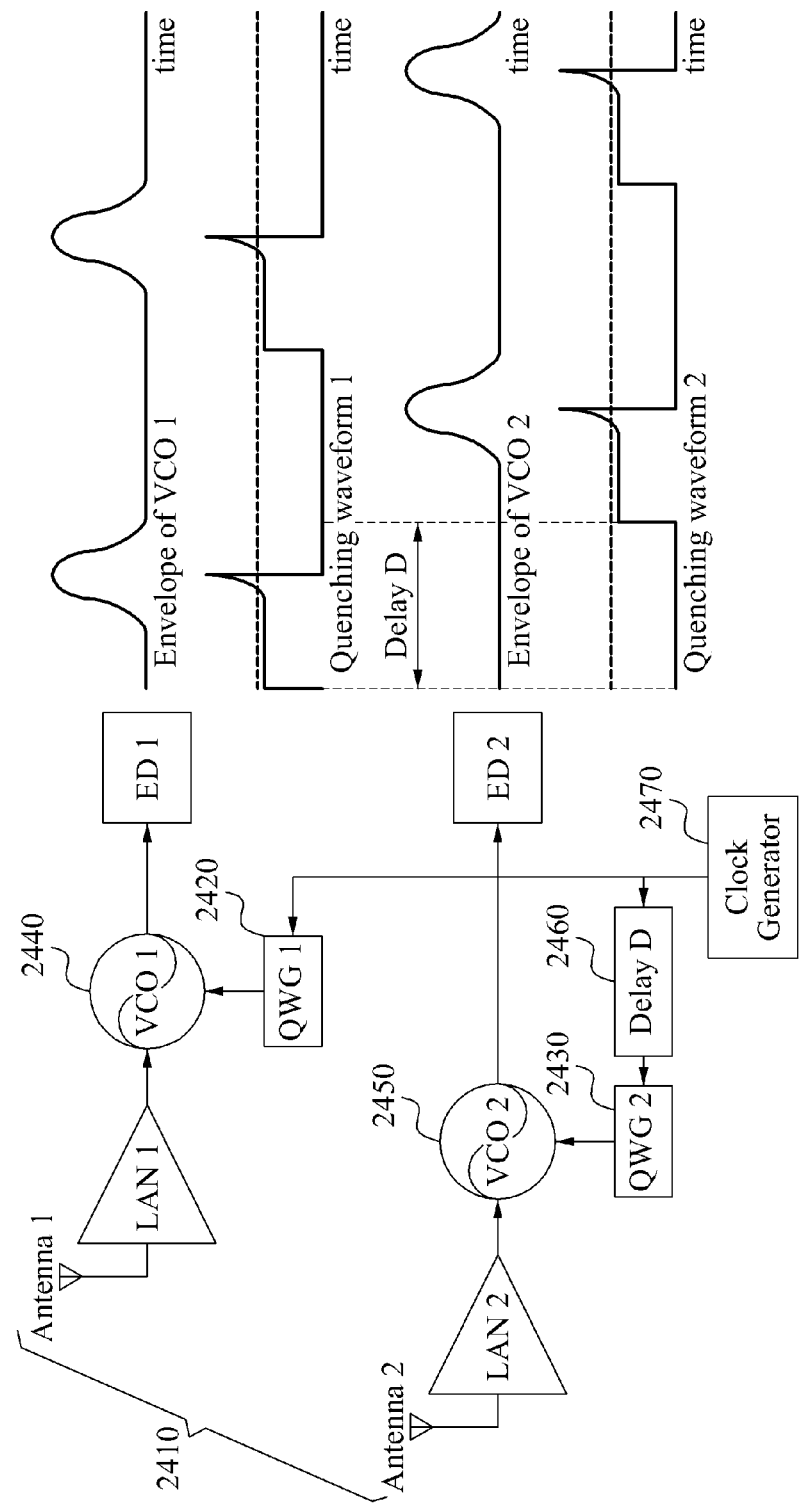
FIG. 24 is a diagram illustrating configuration of an example of an Rx RF part based on multipath diversity using non-overlapped quenching waveforms.

FIG. 24 illustrates configuration of an example of an Rx RF part based on multipath diversity using non-overlapped quenching waveforms. According to this example, the Rx RF part may be implemented by a multiple antenna diversity receiver constituting a transceiver 2400. The transceiver 2400 may include a plurality of antennas 2410, a first QWG 2420, a second QWG 2430, a first VCO 2440, a second VCO 2450, the delay D 2460, and the CLK generator 2470.

Referring to FIG. 24, configuration of an Rx RF part that generates the non-overlapped quenching waveforms using a CLK generator 2470 and a delay D 2460 is shown. In addition, the quenching waveforms generated by the Rx RF part also are shown.

The plurality of antennas 2410 may include at least two antennas, for example, a first antenna and a second antenna.

The first QWG 2420 controls a quenching waveform of a first Rx RF part corresponding to the first antenna. The second QWG 2430 controls a quenching waveform of a second Rx RF part corresponding to the second antenna. The quenching waveforms may be generated respectively by the first VCO 2440 and the second VCO 2450 which operate at a same frequency. For example, the quenching waveform of the first Rx RF part may be generated to control the first VCO 2440, and the quenching waveform of the second Rx RF part may be generated to control the second VCO 2450, where the first VCO 2440 and the second VCO 2450 operate at the same frequency.

The first QWG 2420 and the second QWG 2430 control the first VCO 2440 and the second VCO 2450 using quenching waveforms of the first Rx RF part and the second Rx RF part that do not overlap. For example, a guard time, such as the guard time 2350, may be set between the quenching waveform of the first Rx RF part and the quenching waveform of the second Rx RF part. As explained above, the guard time is a time interval that prevents an output of any one VCO among the plurality of VCOs from interfering with the output of another VCO. The guard time may have a greater time value than a quenching delay caused by discharge of any one of the VCOs.

The first QWG 2420 controls the point in time of oscillation of a corresponding VCO, for example, the first VCO 2440, by controlling the current input to the first VCO 2440. In the same manner, the second QWG 2430 controls the point in time of oscillation of a corresponding VCO, for example, the second VCO 2450, by controlling the current input to the second VCO 2450.

The first QWG 2420 and the second QWG 2430 control the point of time of oscillation of the corresponding VCOs, respectively, so that the corresponding VCOs oscillate when a bias current of the corresponding VOCs corresponds to a predetermined critical current, as shown in FIG. 23. Here, the delay D 2460 and the CLK generator 2470 may be used to control the point in time of oscillation the VCOs. For example, the same clock generated by the CLK generator 2470 may be delayed by the delay D 2460 and applied to the second QWG 2430 to control the time of oscillation of the second VCO 2450.

FIG. 25 illustrates an example of a transceiver that includes a plurality of PLLs, a plurality of VCOs, and a plurality of QWGs. FIG. 25 shows configuration of the transceiver to which a combination of a switching method and a multipath diversity method of a PLL is applied using pluralities of independent PLLs, VCOs, and QWGs. In this example, the PLL may control an operating frequency by adjusting a voltage input to the VCO; the QWG may control the oscillation of the VCO by controlling a current input to the VCO; and the QWG may control a bias current of the VCO.

As shown in FIG. 25, the VCOs are controlled by different PLLs and QWGs, respectively. The PLL determines the operating frequency while the QWG determines the operating time of the VCO. The plurality of QWGs according to this example may generate quenching waveforms such that the quenching waveforms do not overlap, as shown in FIG. 23, to prevent interference among the plurality of VCOs.

FIG. 26 illustrates an example of a transceiver 2600. As shown in to FIG. 26, the transceiver 2600 may include the Tx RF part 2610, a PLL 2630, and the Rx RF part 2650.

The Rx RF part 2610 may include a transmission QWG (QWG Tx) 2611 and a transmission VCO (VCO Tx) 2613. The QWG Tx 2611 controls point of time of oscillation in a quenching waveform generated by the VCO Tx 2613. For example, the QWG Tx 2611 may determine an operating time of the VCO Tx 2613 controlling a current input to the VCO Tx 2613.

The PLL 2630 determines an operating frequency with respect to the Tx RF part 2610 and the Rx RF part 2650, by controlling a voltage input to the VCO Tx 2613 and the VCO Rx 2653. In this example, the VCO Tx 2613 and the VCO Rx 2653 may be operated at the same frequency.

The Rx RF part 2650 may include a reception QWG (QWG Rx) 2651 and a reception VCO (VCO Rx) 2653. The QWG Rx 2651 controls a point of time of oscillation according to a quenching waveform controlling the VCO Rx 2653. The QWG Tx 2611 and the QWG Rx 2651 control the VCO Tx 2613 and the VCO Rx 2653 so that the quenching waveforms for the corresponding VCOs do not overlap.

Figure 27:
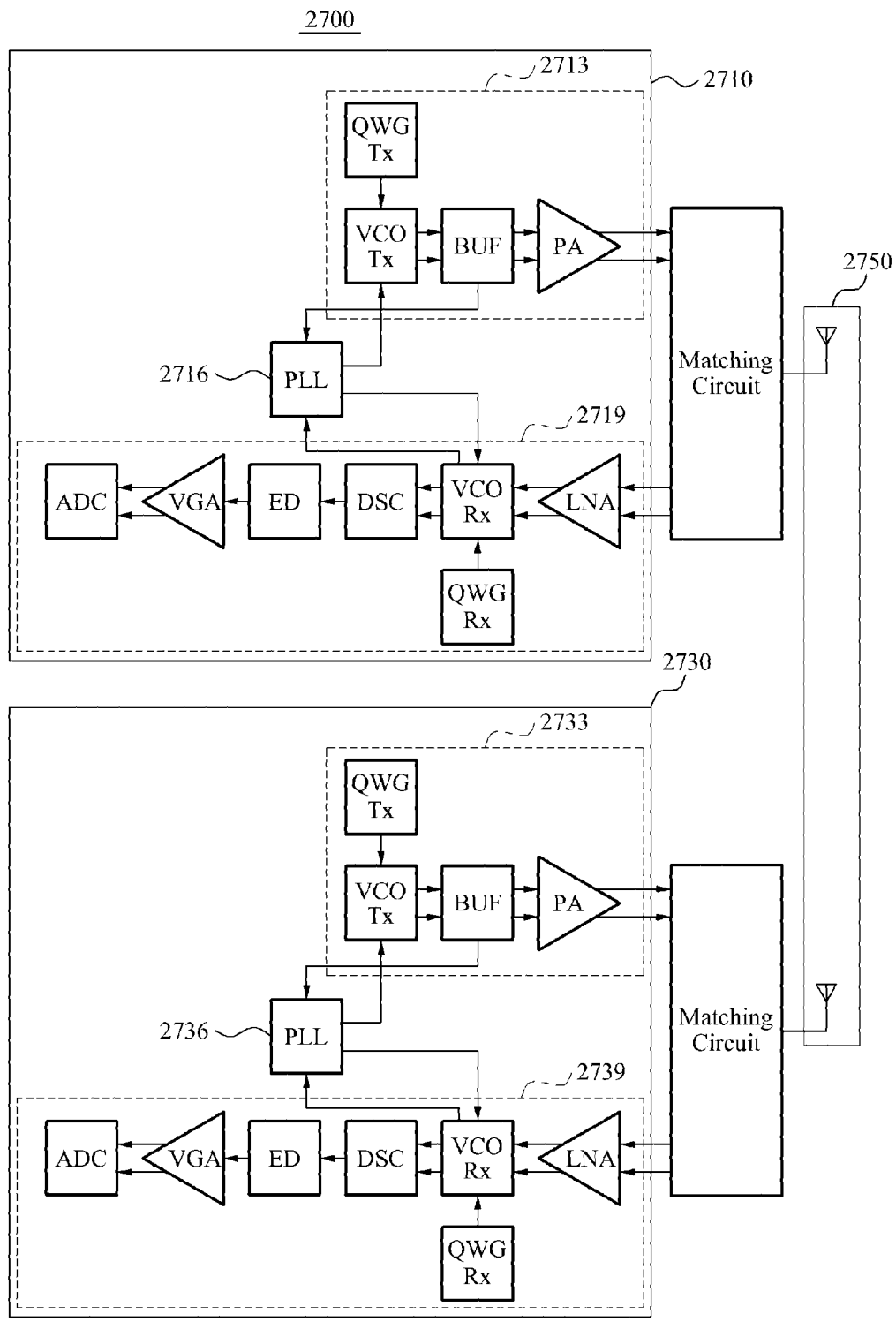
FIG. 27 is a diagram illustrating configuration of another example of a transceiver.

FIG. 27 illustrates configuration of another example of a transceiver 2700. Referring to FIG. 27, the transceiver 2700 may include a first RF part 2710, a second RF part 2730, and a plurality of antennas 2750. The first RF part 2710 may include a first Tx RF part 2713, a first PLL 2716, and a first Rx RF part 2719. The second RF part 2730 may include a second Tx RF part 2733, a second PLL 2736, and a second Rx RF part 2739.

The first PLL 2716 and the second PLL 2736 provide a reception frequency to the corresponding reception parts and provide a transmission frequency to the corresponding transmission parts, respectively. In addition, the first PLL 2716 and the second PLL 2736 are controlled according to whether the corresponding reception parts or transmission parts are turned on. In this example, the first Tx RF part 2713 and the second Tx RF part 2733 may be configured in a same manner as the Tx RF part 2610 of FIG. 26. Also, the first Rx RF part 2719 and the second Rx RF part 2739 may be configured in a same manner as the Rx RF part 2650 of FIG. 26. Therefore, for configuration of the Tx RF parts 2713 and 2733 and the Rx RF parts 2719 and 2739 one may refer to the corresponding description provided above.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A transceiver, comprising:
a reception (Rx) radio frequency (RF) part configured to process a received signal;
a transmission (Tx) RF part configured to process a transmitted signal; and
a phase lock loop (PLL) configured to provide a reception frequency to the reception RF part and provide a transmission frequency to the transmission RF part,
wherein the PLL is controlled according to whether the reception RF part or the transmission RF part is on,
wherein the PLL comprises a charge pump that is sequentially controlled to decrease lock time of the PLL and to subsequently decrease phase noise when the PLL is turned off.

2. The transceiver of claim 1, wherein the PLL comprises:
a reception voltage controlled oscillator (VCO Rx) configured to generate the reception frequency; and
a transmission VCO (VCO Tx) configured to generate the transmission frequency.

3. The transceiver of claim 2, wherein the PLL comprises a single common control circuit connected to the VCO Rx and the VCO Tx.

4. The transceiver of claim 3, wherein the PLL is configured to turn on the single common control circuit according to whether the Rx RF part or the Tx RF part is turned on.

5. The transceiver of claim 3, wherein the PLL comprises switches connected to the VCO Rx and the VCO Tx, and the single common control circuit is connected to the VCO Rx and the VCO Tx through the switches which are switched according to whether the Rx RF part or the Tx RF part is turned on.

6. The transceiver of claim 3, wherein the single common control circuit comprises:
a loop filter (LF) configured to vary a control voltage according to a predetermined amount of charges for the VCO Rx or the VCO Tx,
wherein the charge pump is further configured to pump a predetermined amount of charges corresponding to a pulse width detected by a phase frequency detector (PFD).

7. The transceiver of claim 6, wherein the PLL further comprises:
a mismatch compensation device configured to independently control a magnitude of a source current applied to the main CP and a magnitude of a sink current applied to the main CP to compensate for a current mismatch generated in the main CP.

8. The transceiver of claim 7, wherein the mismatch compensation device comprises:
a first tuning device configured to control a sink current of an auxiliary CP according to a result detected from a sensing capacitor and perform discrete tuning with respect to the current mismatch generated in the main CP by; and
a second tuning device comprising a mismatch current mirror configured to compensate for the current mismatch based on a result of the discrete tuning.

9. The transceiver of claim 8, wherein the first tuning device comprises:

a CP controller configured to detect a voltage generated by the sensing capacitor and to control the sink current of the auxiliary CP according to the detected voltage; and
a clock generator configured to provide the CP controller with an external clock supplied from outside of the PLL.

10. The transceiver of claim 8, wherein the second tuning device further comprises:
a replica CP configured to provide the result of the discrete tuning; and
a comparator configured to compare voltages of opposite poles of the sensing capacitor and generate a result;
wherein the mismatch current mirror is further configured to compensate for the current mismatch based on the result of the comparator.

11. The transceiver of claim 6, wherein the PLL is configured to control a lock time with respect to the reception frequency or the transmission frequency by controlling a bandwidth of the main CP.

12. The transceiver of claim 11, wherein the PLL is configured to accelerate the lock time by increasing the bandwidth of the main CP and to control phase noise caused when the PLL is turned off by reducing the bandwidth of the main CP.

13. The transceiver of claim 2, wherein the VCO Rx or the VCO Tx comprises a class-C type VCO including an inductor capacitor (LC) tank.

14. The transceiver of claim 2, wherein the PLL comprises a leakage compensation device configured to compensate for a voltage leaking from the VCO Rx or the VCO Tx when the PLL is turned off.

15. The transceiver of claim 14, wherein the leakage compensation device is configured to compensate for the leaking voltage using:
a locked control voltage at the time the transmission frequency locks or the time the reception frequency lock; and
a control voltage that is varied when the Rx RF part or the Tx RF part is turned off.

16. The transceiver of claim 15, wherein the leakage compensation device comprises:
an analog to digital converter (ADC) configured to generate a digital signal based on a difference between the locked control voltage and the varied control voltage; and
a leakage current control device configured to generate a control signal, based on the digital signal, to control a leakage compensation CP configured to compensate for leaking charges.

17. The transceiver of claim 16, wherein the leakage compensation device is further configured to control a control voltage of the VCO Rx or the VCO Tx by controlling a resolution of the ADC.

18. The transceiver of claim 15, wherein the leakage compensation device comprises:
a comparator configured to compare a difference between the locked control voltage and the varied control voltage; and
a leakage current control device configured to generate a control signal, based on a comparison result, to control a leakage compensation CP to compensate for leaking charges.

19. The transceiver of claim 1, wherein the PLL controls a reception lock time for a reception frequency and a transmission lock time for a transmission frequency by controlling a bandwidth of the charge pump.

20. A transceiver, comprising:
a reception (Rx) radio frequency (RF) part configured to process a received signal,
a transmission (Tx) RF part configured to process a transmitted signal, and
a phase lock loop (PLL) configured to provide a reception frequency to the reception RF part and provide a transmission frequency to the transmission RF part,
wherein the PLL is controlled according to whether the reception RF part or the transmission RF part is on, and
wherein the PLL comprises:
a reception voltage controlled oscillator (VCO Rx) configured to generate the reception frequency;
a transmission VCO (VCO Tx) configured to generate the transmission frequency, and
a single common control circuit connected to the VCO Rx and the VCO Tx, wherein the single common control circuit comprises:
a main charge pump (CP) configured to pump a predetermined amount of charges corresponding to a pulse width detected by a phase frequency detector (PFD); and
a loop filter (LF) configured to vary a control voltage according to the predetermined amount of charges for the VCO Rx or the VCO Tx.

21. The transceiver of claim 20, wherein the PLL further comprises:
a mismatch compensation device configured to independently control a magnitude of a source current applied to the main CP and a magnitude of a sink current applied to the main CP to compensate for a current mismatch generated in the main CP.

22. The transceiver of claim 21, wherein the mismatch compensation device comprises:
a first tuning device configured to control a sink current of an auxiliary CP according to a result detected from a sensing capacitor and perform discrete tuning with respect to the current mismatch generated in the main CP by; and
a second tuning device comprising a mismatch current mirror configured to compensate for the current mismatch based on a result of the discrete tuning.

23. The transceiver of claim 22, wherein the first tuning device comprises:
a CP controller configured to detect a voltage generated by the sensing capacitor and to control the sink current of the auxiliary CP according to the detected voltage; and
a clock generator configured to provide the CP controller with an external clock supplied from outside of the PLL.

24. The transceiver of claim 22, wherein the second tuning device further comprises:
a replica CP configured to provide the result of the discrete tuning; and
a comparator configured to compare voltages of opposite poles of the sensing capacitor and generate a result;
wherein the mismatch current mirror is further configured to compensate for the current mismatch based on the result of the comparator.

25. The transceiver of claim 20, wherein the PLL is configured to control a lock time with respect to the reception frequency or the transmission frequency by controlling a bandwidth of the main CP.

26. The transceiver of claim 25, wherein the PLL is configured to accelerate the lock time by increasing the bandwidth of the main CP and to control phase noise caused when the PLL is turned off by reducing the bandwidth of the main CP.

27. A transceiver, comprising:
a reception (Rx) radio frequency (RF) part configured to process a received signal;
a transmission (Tx) RF part configured to process a transmitted signal, and
a phase lock loop (PLL) configured to provide a reception frequency to the reception RF part and provide a transmission frequency to the transmission RF part,
wherein the PLL is controlled according to whether the reception RF part or the transmission RF part is on,
wherein the PLL comprises:
a reception voltage controlled oscillator (VCO Rx) configured to generate the reception frequency,
a transmission VCO (VCO Tx) configured to generate the transmission frequency, and
a leakage compensation device configured to compensate for a voltage leaking from the VCO Rx or the VCO Tx when the PLL is turned off.

28. The transceiver of claim 27, wherein the leakage compensation device is configured to compensate for the leaking voltage using:
a locked control voltage at the time the transmission frequency locks or the time the reception frequency lock; and
a control voltage that is varied when the Rx RF part or the Tx RF part is turned off.

29. The transceiver of claim 28, wherein the leakage compensation device comprises:
an analog to digital converter (ADC) configured to generate a digital signal based on a difference between the locked control voltage and the varied control voltage; and
a leakage current control device configured to generate a control signal, based on the digital signal, to control a leakage compensation CP configured to compensate for leaking charges.

30. The transceiver of claim 29, wherein the leakage compensation device is further configured to control a control voltage of the VCO Rx or the VCO Tx by controlling a resolution of the ADC.

31. The transceiver of claim 28, wherein the leakage compensation device comprises:
a comparator configured to compare a difference between the locked control voltage and the varied control voltage; and
a leakage current control device configured to generate a control signal, based on a comparison result, to control a leakage compensation CP to compensate for leaking charges.

32. A transceiver configured to operate in a transmission (Tx) mode or a reception (Rx) mode comprising:
a Rx radio frequency (RF) part configured to process a received signal;
a Tx RF part configured to process a transmitted signal; and
a phase lock loop (PLL) comprising a Rx voltage controlled oscillator (VCO) configured to provide a reception frequency to the reception RF part and a Tx voltage controlled oscillator (VCO) configured to provide a transmission frequency to the transmission RF part,
wherein the Rx mode refers to a mode in which the received signal is processed by the Rx RF part, and the Tx mode refers to a mode in which the transmitted signal is processed by the Tx RF, wherein the PLL further comprises a charge pump that is sequentially controlled to decrease lock time of the PLL and to decrease phase noise when the PLL is turned off.

33. The transceiver of claim 32 further comprising a common control circuit configured to be connected to the Rx VCO X when the Rx RF part is turned on in the Rx mode to generate the reception frequency and to be connected to the Tx VCO when Tx RF part is turned on in the Tx mode to generate the transmission frequency, wherein the transceiver performs transmission and reception using only the one PLL according to the on and off states of the Rx RF part and the Tx RF part.

34. The transceiver of claim 33, wherein average power consumption of the PLL is reduced by reducing the on time of the PLL and the power consumed during the off time of the PLL.

35. The transceiver of claim 32, wherein when power is first applied to the transceiver, the PLL of the transceiver is configured to perform initial calibration to compensate for a difference between up and down source currents of a CP of the PLL, the initial calibration not being performed in the transmission mode or the reception mode.

36. The transceiver of claim 35, wherein during the initial calibration, a control voltage of either VCO is locked through coarse tuning and then fine tuning of the PLL.

37. The transceiver of claim 32 wherein when the transceiver operates in the Tx mode, the PLL connected to the Tx RF part is turned on to lock to a transmission frequency for the Tx RF part, and after the Tx RF part is locked, the PLL connected to the Tx RF part is turned off.

38. The transceiver of claim 37, further comprising a leakage compensation device, wherein when the PLL connected to the transmission RF part is turned on, operation of the leakage compensation device is turned on to compensate for a voltage leaked during an off period of the PLL.

39. The transceiver of claim 38, wherein when the PLL is powered off, the voltage for only the VCO and the compensation circuit is applied overcoming any frequency drift and phase noise deterioration that occurs when the PLL is turned off.

40. The transceiver of claim 32 wherein when the transceiver operates in the Rx mode, the PLL connected to the Rx RF part is turned on to lock to the reception frequency for the Rx RF part, and after the Rx FR part is locked, the PLL connect to the Rx RF part is turned off.

41. The transceiver of claim 40, further comprising a leakage compensation device wherein when the PLL connected to the transmission RF part is turned on, operation of the leakage compensation device is turned on to compensate for a voltage leaked during an off period of the PLL.

42. The transceiver of claim 41, wherein when the PLL is powered off, the voltage for only the VCO and the compensation circuit is applied overcoming any frequency drift and phase noise deterioration that occurs when the PLL is off.

43. The transceiver of claim 32, wherein the PLL controls a lock time for a reception frequency and a lock time for a transmission frequency by controlling a bandwidth of the charge pump.

* * * * *